US012293972B2

(12) United States Patent
Kasikornrungroj et al.

(10) Patent No.: US 12,293,972 B2
(45) Date of Patent: May 6, 2025

(54) SEMICONDUCTOR DEVICE AND METHOD OF FORMING LEADFRAME WITH CLIP BOND FOR ELECTRICAL INTERCONNECT

(71) Applicant: UTAC Headquarters Pte. Ltd., Singapore (SG)

(72) Inventors: Natawat Kasikornrungroj, Bangkok (TH); Phongsak Sawasdee, Bangkok (TH); Wannasat Panphrom, Bangkok (TH)

(73) Assignee: UTAC Headquarters Pte. Ltd., Singapore (SG)

( * ) Notice: Subject to any disclaimer, the term of this patent is extended or adjusted under 35 U.S.C. 154(b) by 358 days.

(21) Appl. No.: 17/643,244

(22) Filed: Dec. 8, 2021

(65) Prior Publication Data

US 2022/0208686 A1 Jun. 30, 2022

Related U.S. Application Data

(60) Provisional application No. 63/131,837, filed on Dec. 30, 2020.

(51) Int. Cl.
| | |
|---|---|
| *H01L 23/495* | (2006.01) |
| *H01L 21/56* | (2006.01) |
| *H01L 23/00* | (2006.01) |
| *H01L 23/31* | (2006.01) |
| *H01L 23/538* | (2006.01) |
| *H01L 25/00* | (2006.01) |
| *H01L 25/065* | (2023.01) |

(52) U.S. Cl.
CPC .......... *H01L 23/5386* (2013.01); *H01L 21/56* (2013.01); *H01L 23/3121* (2013.01); *H01L 23/49575* (2013.01); *H01L 23/5389* (2013.01); *H01L 24/37* (2013.01); *H01L 24/41* (2013.01); *H01L 24/84* (2013.01); *H01L 25/0657* (2013.01); *H01L 25/50* (2013.01); *H01L 23/49513* (2013.01); *H01L 24/16* (2013.01); *H01L 24/38* (2013.01); *H01L 24/48* (2013.01); (Continued)

(58) Field of Classification Search
CPC ........... H01L 23/49575; H01L 23/5389; H01L 24/37; H01L 24/41; H01L 25/0657
USPC .................................................. 257/666, 676
See application file for complete search history.

(56) References Cited

U.S. PATENT DOCUMENTS 6,337,510 B1 * 1/2002 Chun-Jen ............ H01L 25/0657
257/E23.047
6,630,726 B1 * 10/2003 Crowley ........... H01L 23/49524
257/E23.044

(Continued)

*Primary Examiner* — Nitin Parekh
(74) *Attorney, Agent, or Firm* — Robert D. Atkins; PATENT LAW GROUP: Atkins and Associates, P.C.

(57) ABSTRACT

A semiconductor device has a leadframe and a first electrical component including a first surface disposed on the leadframe. A first clip bond is disposed over a second surface of the first electrical component. The first clip bond extends vertically through the semiconductor device. The first clip bond has a vertical member, horizontal member connected to the vertical member, die contact integrated with the horizontal member, and clip foot extending from the vertical member. A second electrical component has a first surface disposed on the first clip bond. A second clip bond is disposed over a second surface of the second electrical component opposite the first surface of the second electrical component. An encapsulant is deposited around the first electrical component and first clip bond. A second electrical component is disposed over the encapsulant. The clip foot is exposed from the encapsulant.

29 Claims, 20 Drawing Sheets

(52) U.S. Cl.
CPC .............. *H01L 24/49* (2013.01); *H01L 24/73* (2013.01); *H01L 24/92* (2013.01); *H01L 2224/16225* (2013.01); *H01L 2224/3701* (2013.01); *H01L 2224/38* (2013.01); *H01L 2224/40475* (2013.01); *H01L 2224/41* (2013.01); *H01L 2224/41109* (2013.01); *H01L 2224/41176* (2013.01); *H01L 2224/4118* (2013.01); *H01L 2224/48106* (2013.01); *H01L 2224/48175* (2013.01); *H01L 2224/49176* (2013.01); *H01L 2224/73221* (2013.01); *H01L 2224/73263* (2013.01); *H01L 2224/73265* (2013.01); *H01L 2224/84005* (2013.01); *H01L 2224/92157* (2013.01); *H01L 2224/92246* (2013.01); *H01L 2924/1811* (2013.01)

(56) References Cited

U.S. PATENT DOCUMENTS

| | | | |
|---|---|---|---|
| 6,707,138 B2* | 3/2004 | Crowley | H01L 24/40 257/676 |
| 6,777,800 B2* | 8/2004 | Madrid | H01L 24/84 257/E23.044 |
| 7,579,675 B2* | 8/2009 | Hosseini | H01L 23/4334 257/E23.101 |
| 8,049,312 B2* | 11/2011 | Herbsommer | H01L 24/41 257/713 |
| 8,304,903 B2* | 11/2012 | Herbsommer | H01L 24/38 257/E23.07 |
| 8,531,016 B2* | 9/2013 | Cho | H01L 21/78 257/675 |
| 9,275,921 B2* | 3/2016 | Miyakawa | H01L 23/28 |
| 9,478,484 B2* | 10/2016 | Otremba | H01L 24/37 |
| 9,589,929 B2* | 3/2017 | Terrill | H01L 21/4853 |
| 2004/0080028 A1* | 4/2004 | Yanagisawa | H01L 24/40 257/676 |
| 2005/0127483 A1* | 6/2005 | Joshi | H01L 23/49555 257/676 |
| 2007/0114352 A1* | 5/2007 | Cruz | H01L 21/6835 257/E23.047 |
| 2009/0230519 A1* | 9/2009 | Otremba | H01L 24/83 438/123 |
| 2010/0164078 A1* | 7/2010 | Madrid | H01L 24/37 438/122 |

* cited by examiner

SEMICONDUCTOR DEVICE AND METHOD OF FORMING LEADFRAME WITH CLIP BOND FOR ELECTRICAL INTERCONNECT

CLAIM OF DOMESTIC PRIORITY

The present application claims the benefit of U.S. Provisional Application No. 63/131,837, filed Dec. 30, 2020, which application is incorporated herein by reference.

FIELD OF THE INVENTION

The present invention relates in general to semiconductor devices and, more particularly, to a semiconductor device and method of forming a leadframe with a clip bond for electrical interconnect.

BACKGROUND OF THE INVENTION

Semiconductor devices are commonly found in modern electronic products. Semiconductor devices perform a wide range of functions, such as signal processing, high-speed calculations, sensors, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

A semiconductor die can be mounted to a leadframe for electrical interconnect and encapsulated for structural support and environmental protection. The leadframe has lead fingers that are wire bonded to the semiconductor die. The lead fingers are exposed along a bottom surface or side surface of the encapsulant, as exemplified by common dual in line (DIP), quad flat package (QFP), and quad flat no-lead package (QFN). The leadframe type semiconductor package has limited electrical interconnect capability, e.g., these packages have little or no vertical electrical interconnect capability.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
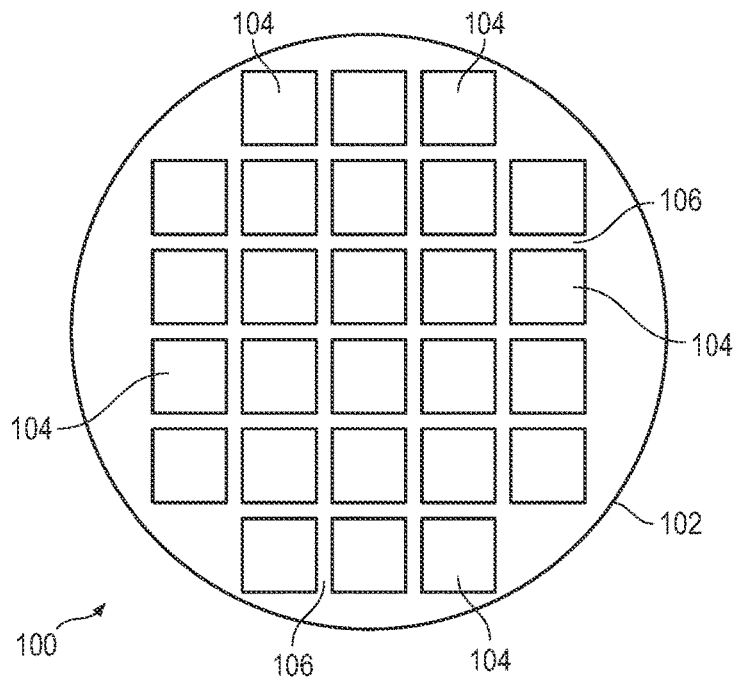
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
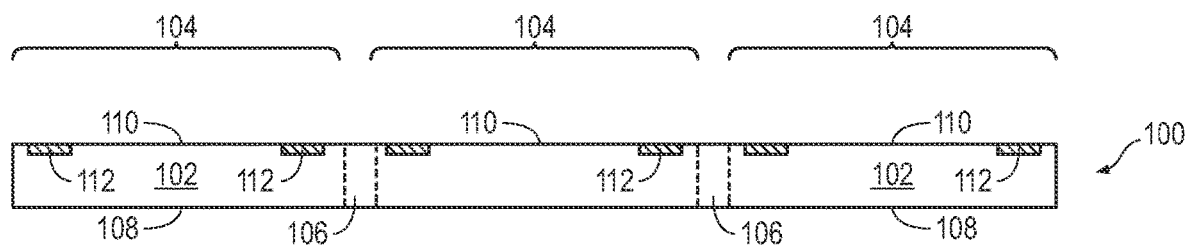

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, sensors, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), platinum (Pt), or other suitable electrically conductive material. Conductive layer 112 operates as contact pads electrically connected to the circuits on active surface 110.

Figure 1C:
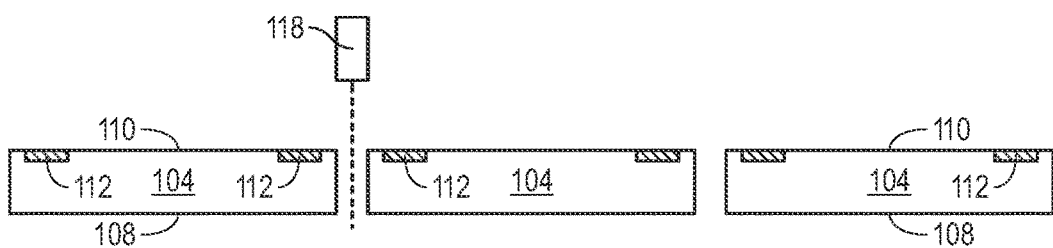

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die (KGD) post singulation.

Figure 2A:
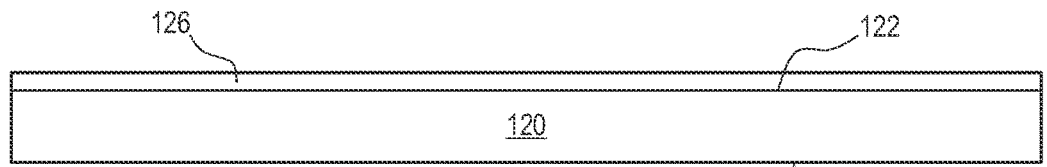
FIGS. 2a-2n illustrate a process of forming a leadframe with a clip bond for electrical interconnect.
Figure 2B:
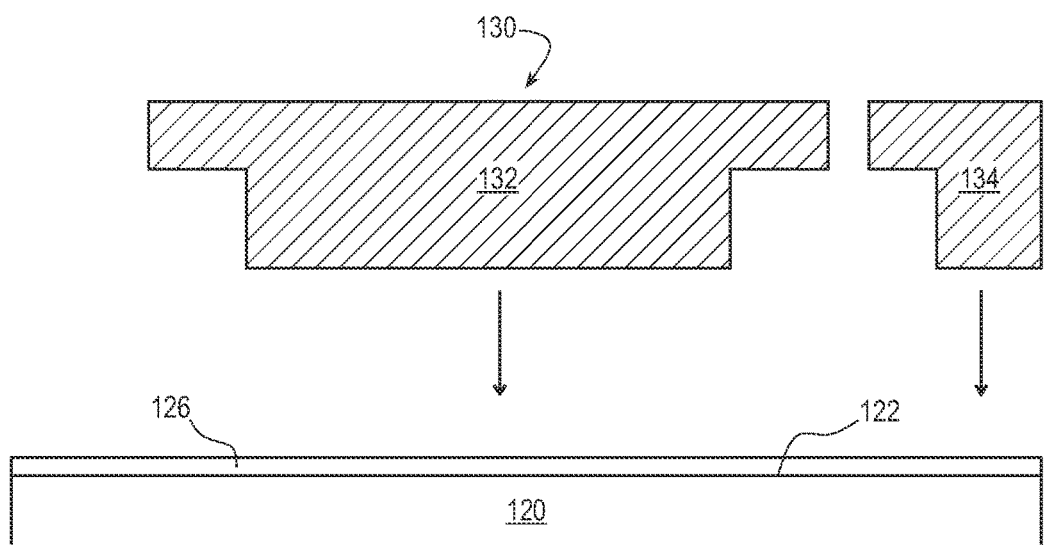
Figure 2C:
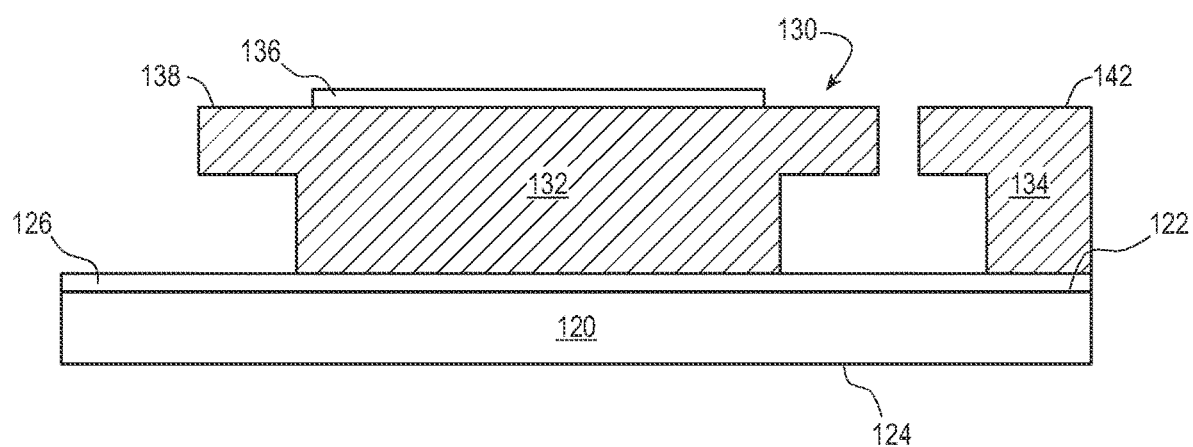
Figure 2D:
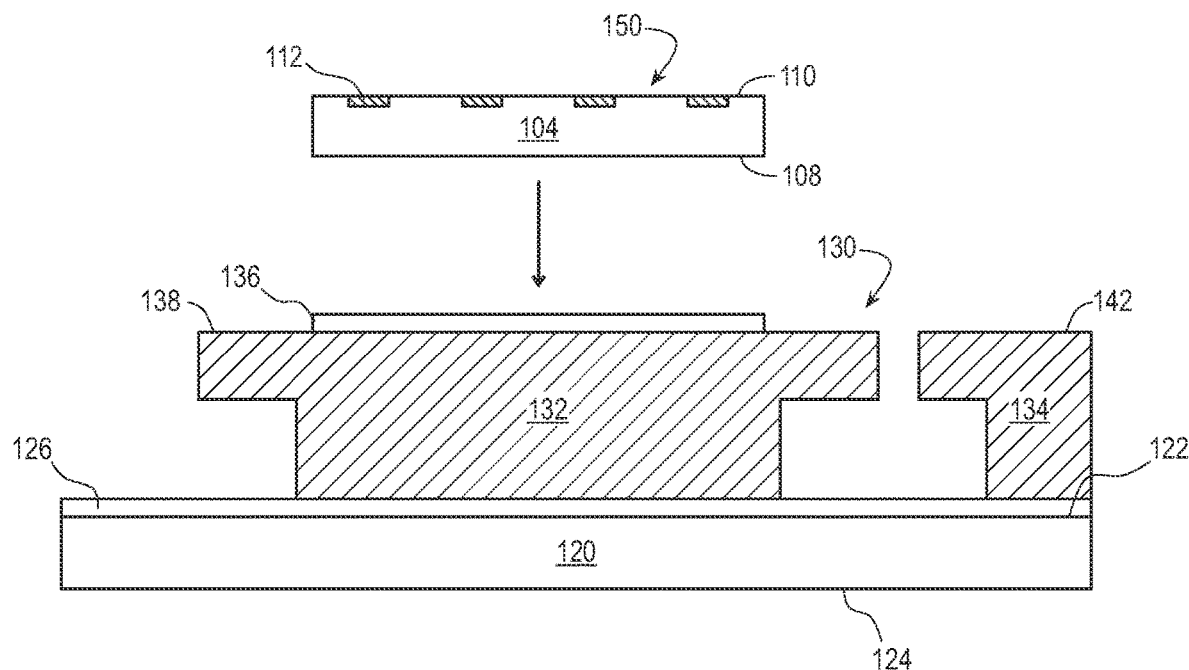
Figure 2E:
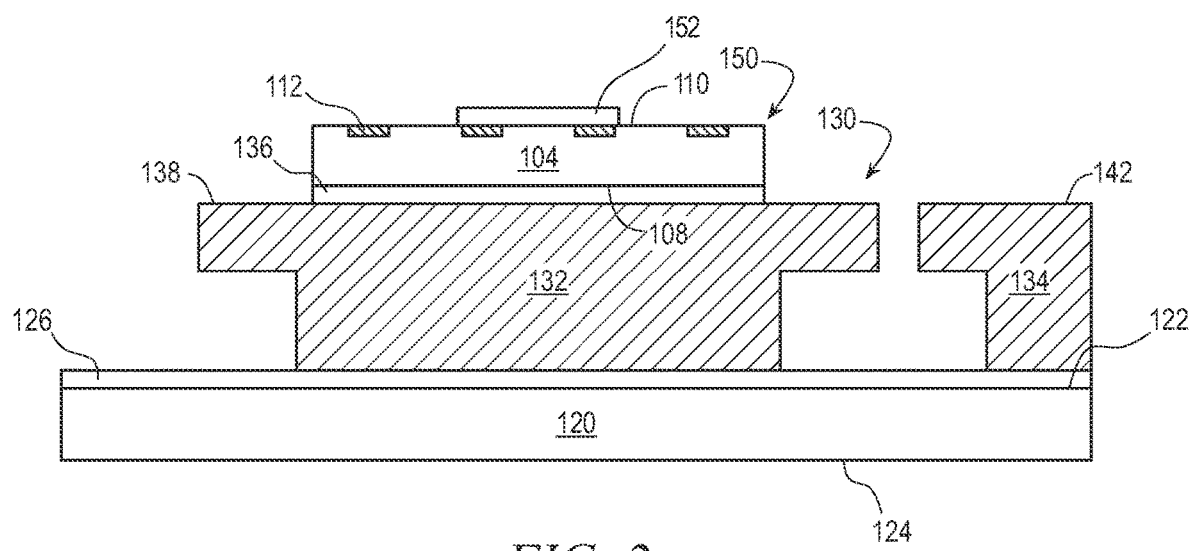
Figure 2F:
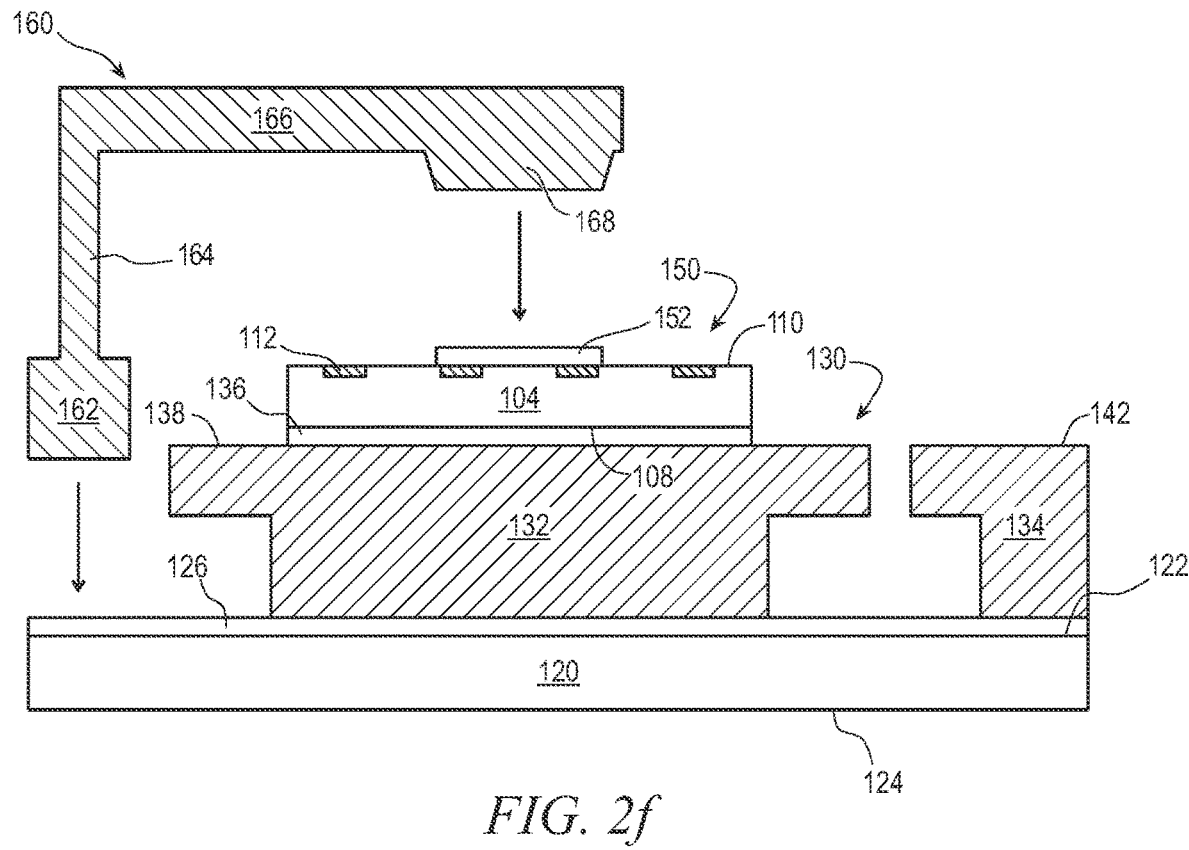
Figure 2G:
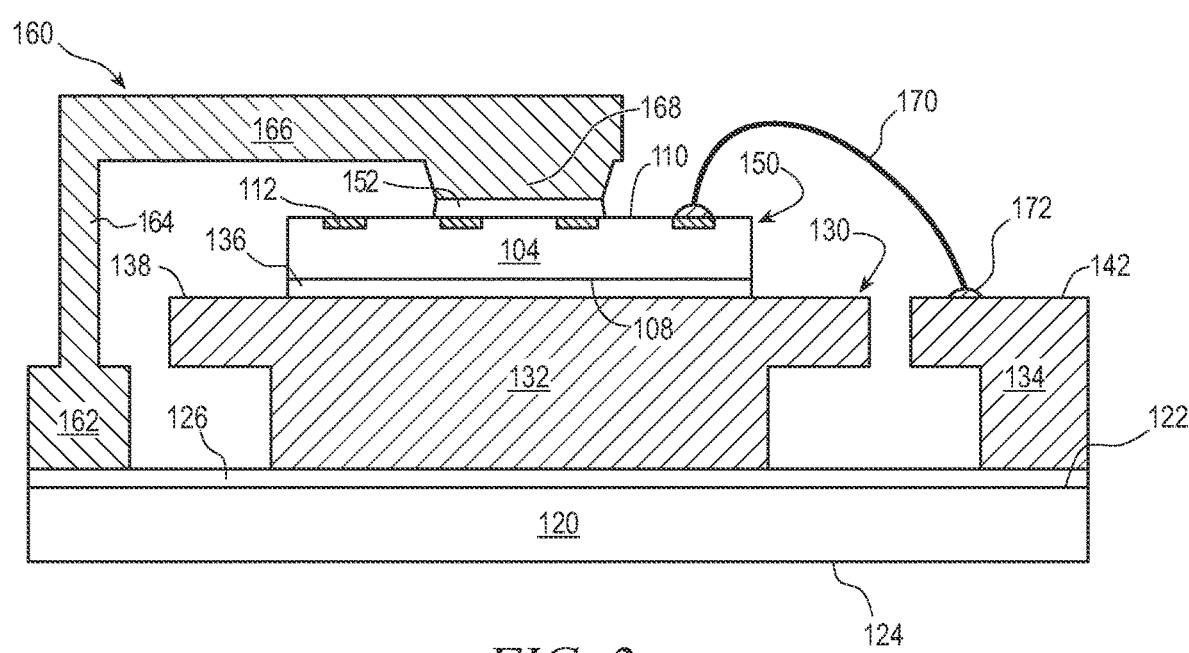
Figure 2H:
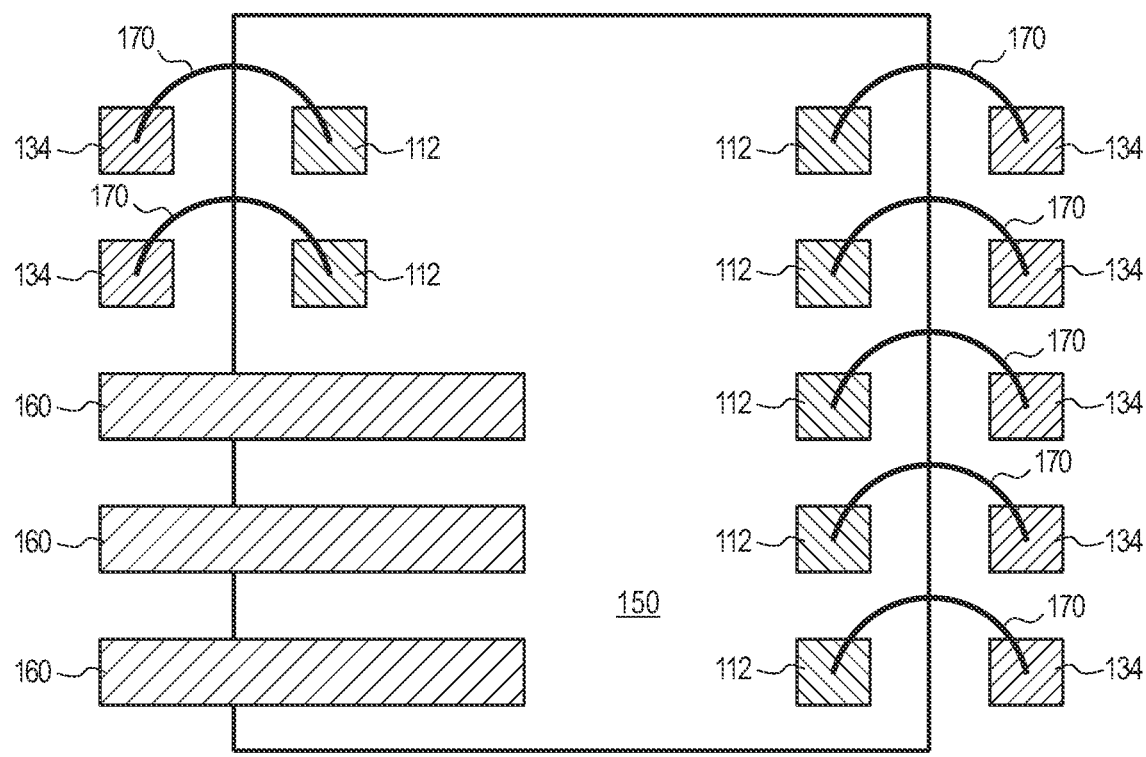
Figure 2I:
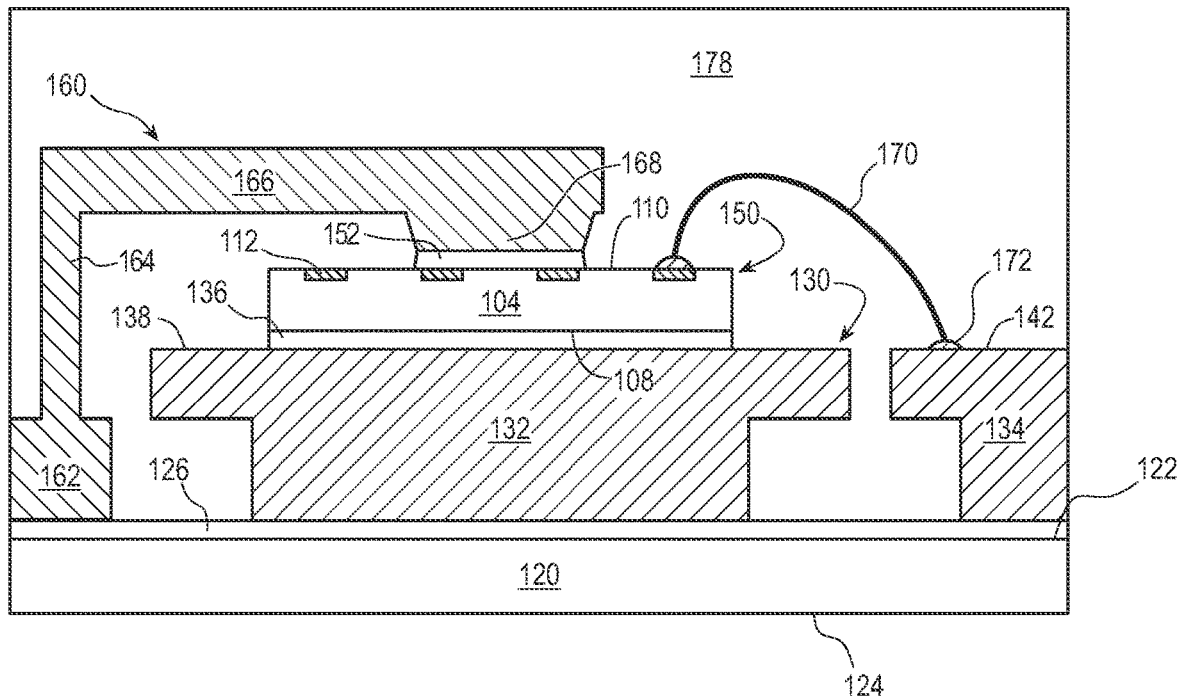
Figure 2J:
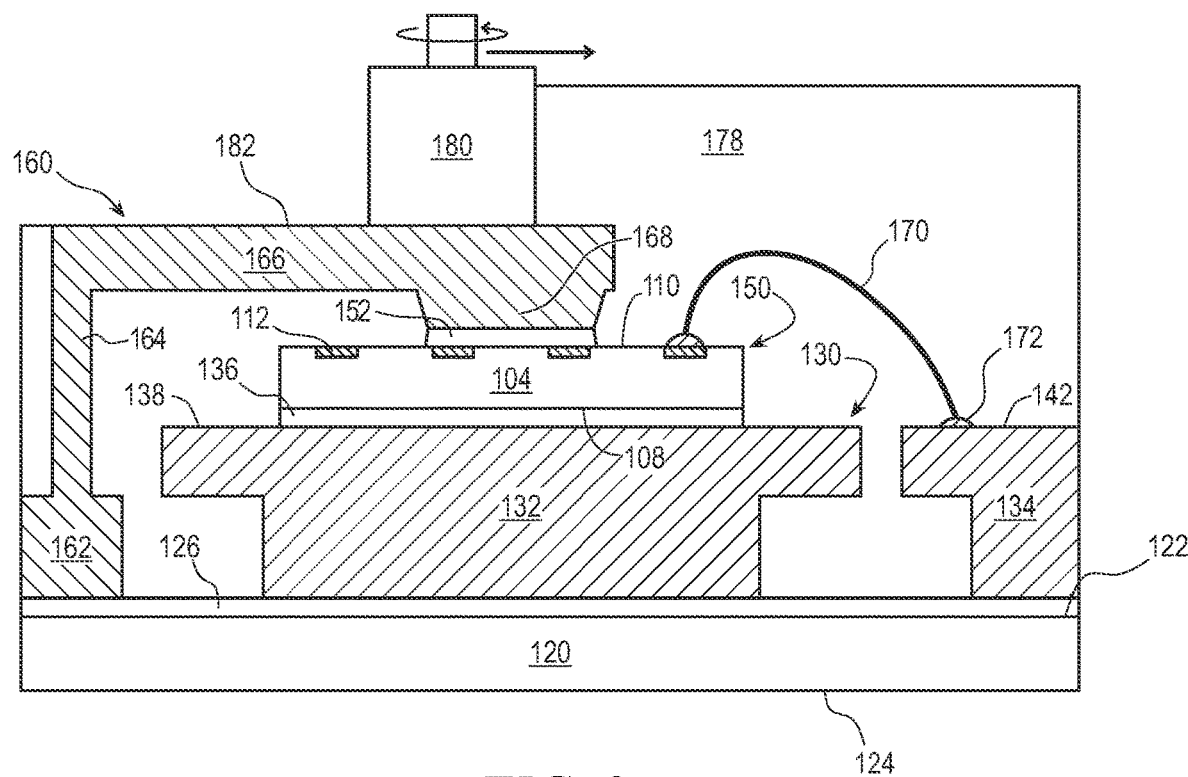
Figure 2K:
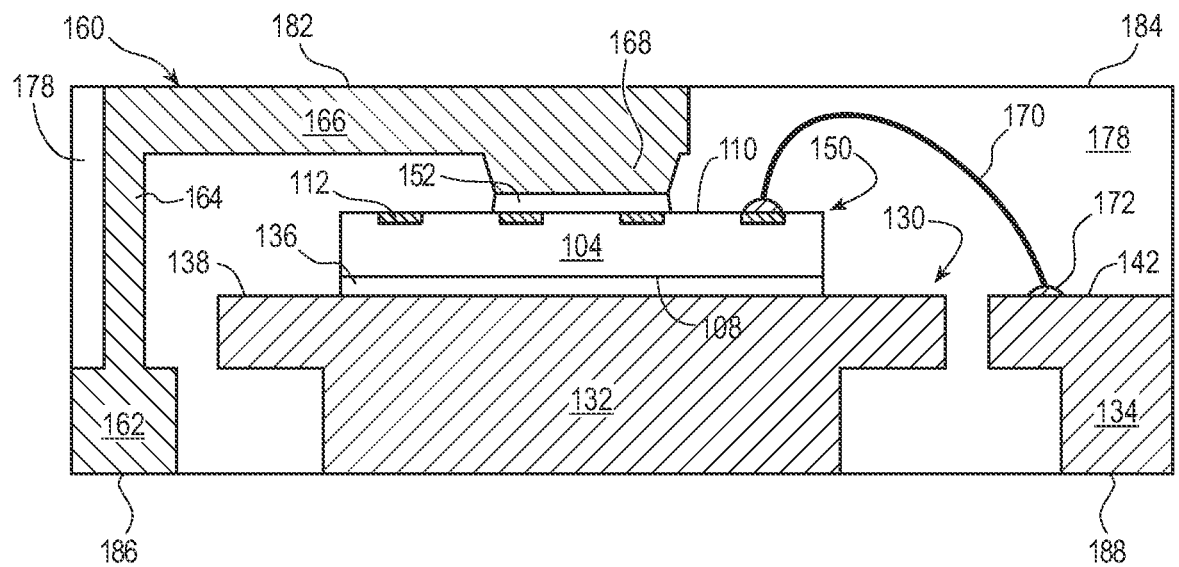
Figure 2L:
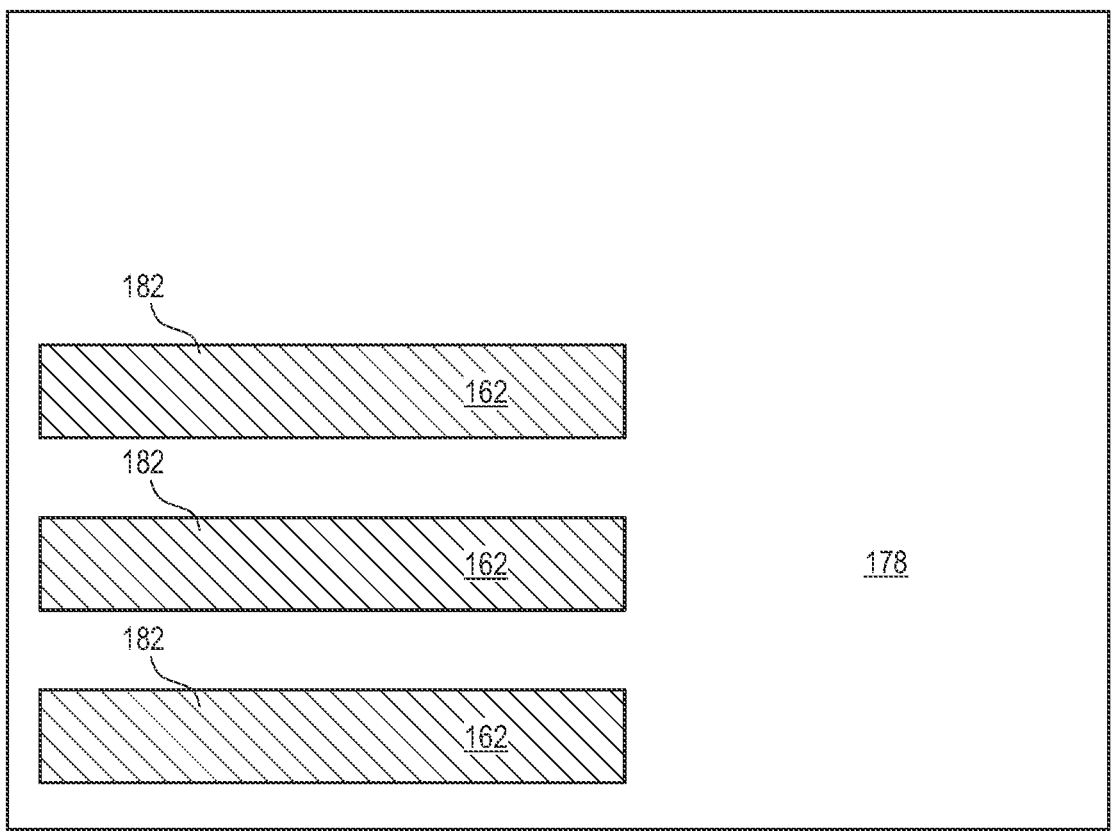
Figure 2M:
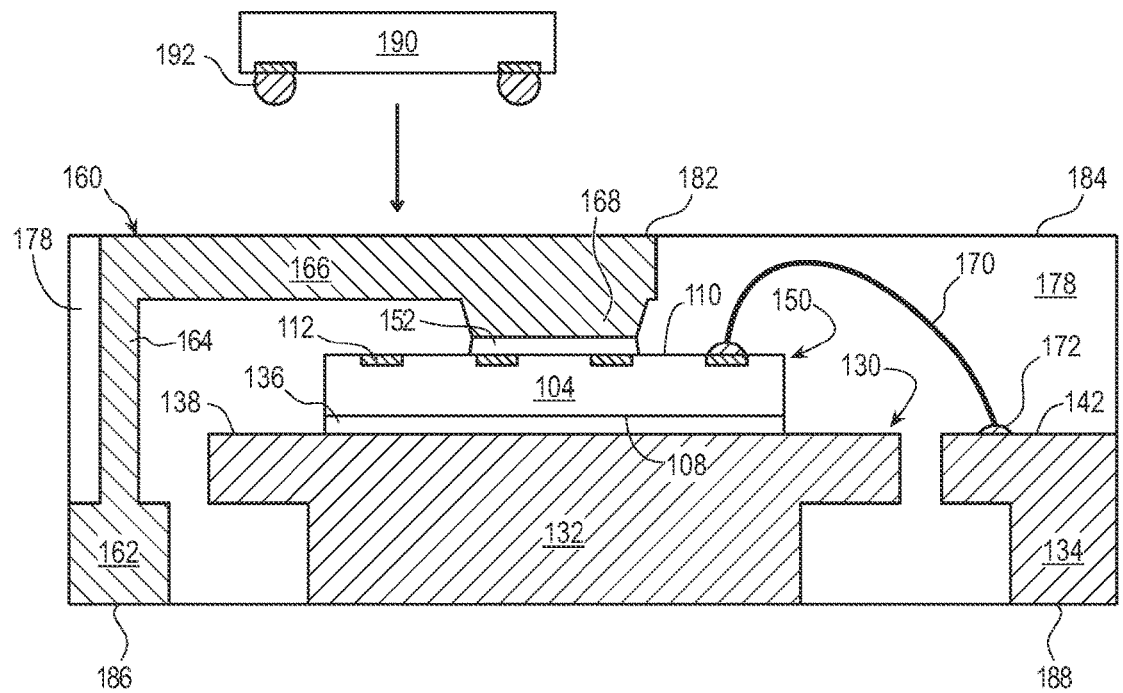
Figure 2N:
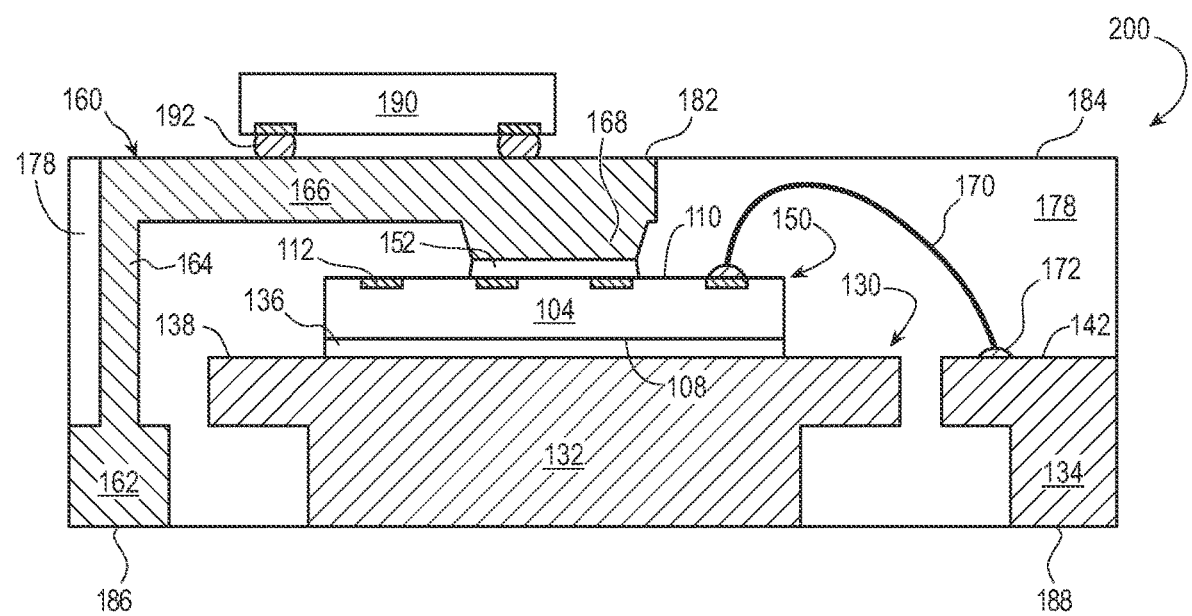

FIGS. 2a-2n illustrate a process of forming a leadframe with a clip bond electrical interconnect. FIG. 2a shows a cross-sectional view of a portion of a carrier or temporary substrate 120 containing sacrificial base material such as silicon, polymer, beryllium oxide, glass, or other suitable low-cost, rigid material for structural support. Substrate 120 has a first surface 122 and second surface 124 opposite surface 122. An interface layer or double-sided tape 126 is formed over substrate 120 as a temporary adhesive bonding film, etch-stop layer, or thermal release layer.

In FIG. 2b, leadframe 130 is positioned over substrate 120 for mounting to the substrate using a pick and place operation. Leadframe 130 includes die mounting site or flag 132 and a plurality of lead fingers 134. Leadframe 130 can be made from Au, Ag, Ni, Pt, Cu, Cu alloys (including one or more elements of nickel, iron, zinc, tin, chromium, silver, and phosphorous), or other suitable conductive materials. Leadframe 130 can be a pre-plated leadframe (PPF) or a laminated leadframe. Leadframe 130 can be stamped, etched, or 3D laser printed into any shape corresponding to a leadframe form and function. Leadframe 130 provides structural support and electrical interconnection for electrical components, such as semiconductor die 104. FIG. 2c shows leadframe 130 mounted to substrate 120 using the adhesive property of interface layer 126. Adhesive layer 136 is deposited on surface 138 of flag 132.

In FIG. 2d, electrical component 150 is positioned over leadframe 130 using a pick and place operation. For example, electrical component 150 can be semiconductor die 104 from FIG. 1c with back surface 108 oriented toward surface 138 of flag 132. Electrical component 150 is secured to flag 132 with adhesive 136, as shown in FIG. 2e. Conductive paste 152 is deposited on active surface 110 to make electrical connection to a portion of conductive layer 112.

In FIG. 2f, clip bond 160 is positioned over substrate 120 and electrical component 150. Clip bond 160 includes clip foot 162, vertical member 164, horizontal member 166, and die contact 168 integrated with the horizontal member. Clip bond 160 can be made with Au, Ag, Ni, Pt, Cu, Cu alloys (including one or more elements of nickel, iron, zinc, tin, chromium, silver, and phosphorous), or other suitable conductive materials. Clip bond 160 can be stamped, etched, or 3D laser printed into any shape corresponding to form and function. Clip bond 160 provides structural support and vertical and horizontal electrical interconnection for electrical component 150. Clip bond 160 is mounted to substrate 120 and electrical component 150, as shown in FIG. 2g. Clip foot 162 is secured to substrate 120 by the adhesive property of interface layer 126. Die contact 168 is mechanically and electrically connected to conductive layer 112 with conductive paste 152. Conductive paste 152 is cured to form a permanent mechanical and electrical connection between electrical component 130 and die contact 168. Bond wire 170 is connected between a portion of conductive layer 112 and lead finger 134 using solder paste 172 or other conductive paste on conductive layer 112 and surface 142 of lead finger 134.

Any number of clip bonds 160 and bond wires 170 can be connected to electrical component 150. FIG. 2h shows a top view of electrical component 150 with a plurality of clip bonds 160 and a plurality of bond wires 170 between conductive layer 112 and surface 142 of lead finger 134.

In FIG. 2i, encapsulant or molding compound 178 is deposited over and around clip bond 160, leadframe 130, and electrical component 150 using a paste printing, compressive molding, transfer molding, liquid encapsulant molding, vacuum lamination, spin coating, film assisted molding (FAM), or other suitable applicator. Encapsulant 178 can be polymer composite material, such as epoxy resin with filler, epoxy acrylate with filler, or polymer with proper filler. Encapsulant 178 is non-conductive, provides structural support, and environmentally protects the semiconductor device from external elements and contaminants.

In FIG. 2j, a portion of encapsulant 178 is removed by grinder 180 to expose surface 182 of horizontal member 166 of clip bond 160 coplanar with surface 184 of encapsulant 178. Grinder 180 planarizes surface 182 of clip bond 160 and surface 184 of encapsulant 178, as shown in FIG. 2k. Temporary substrate 120 and interface layer 126 are removed by chemical etching, mechanical peel-off, chemical mechanical planarization (CMP), mechanical grinding, thermal bake, laser scanning, or wet stripping. Removing temporary substrate 120 exposes surface 186 of clip foot 162, as well as surface 188 of lead finger 134. FIG. 2l is a top view of surfaces 182 of horizontal members 162 of clip bonds 160 with encapsulant 178.

In FIG. 2m, electrical component 190 is positioned over surface 182 of clip bond 160 using a pick and place operation. Electrical component 190 can be made similar to semiconductor die 104 from FIG. 1c, with a different format and function, and bumps 192 oriented toward surface 182 of horizontal member 166. Alternatively, electrical component 190 can include other semiconductor die, semiconductor package, surface mount device, discrete electrical device, discrete transistor, diode, or IPD. Electrical component 190 is mounted to horizontal member 162 of clip bond 160, as shown in FIG. 2n, with bumps 192 making mechanical and electrical connection to surface 182 and possibly other portions of the clip bond.

Semiconductor package 200 provides more interconnect flexibility to electrical component 150 with both clip bonds 160 and bond wires 170. Semiconductor package 200 provides vertical and horizontal electrical interconnect capability with clip bond 160 having exposed electrical connectivity on the top surface and bottom surface of the package. Semiconductor package 200 enables direct connection between multiple components, reduces conductive path length and electrical resistance to increase product performance, provides more power efficiency in high power applications and reduces footprint of the package for application to PCB. Semiconductor package 200 provides for device stacking, e.g., with electrical component 190.

Figure 3A:
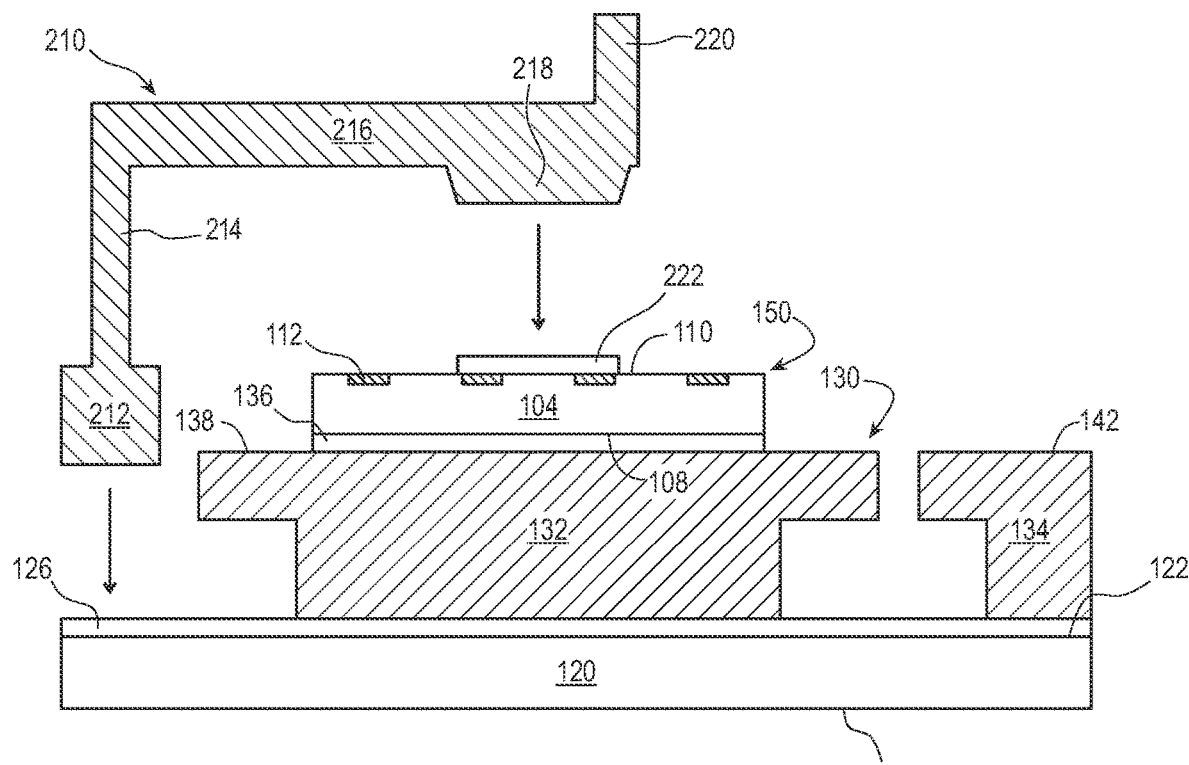
FIGS. 3a-3e illustrate a second embodiment of the leadframe and clip bond.
Figure 3B:
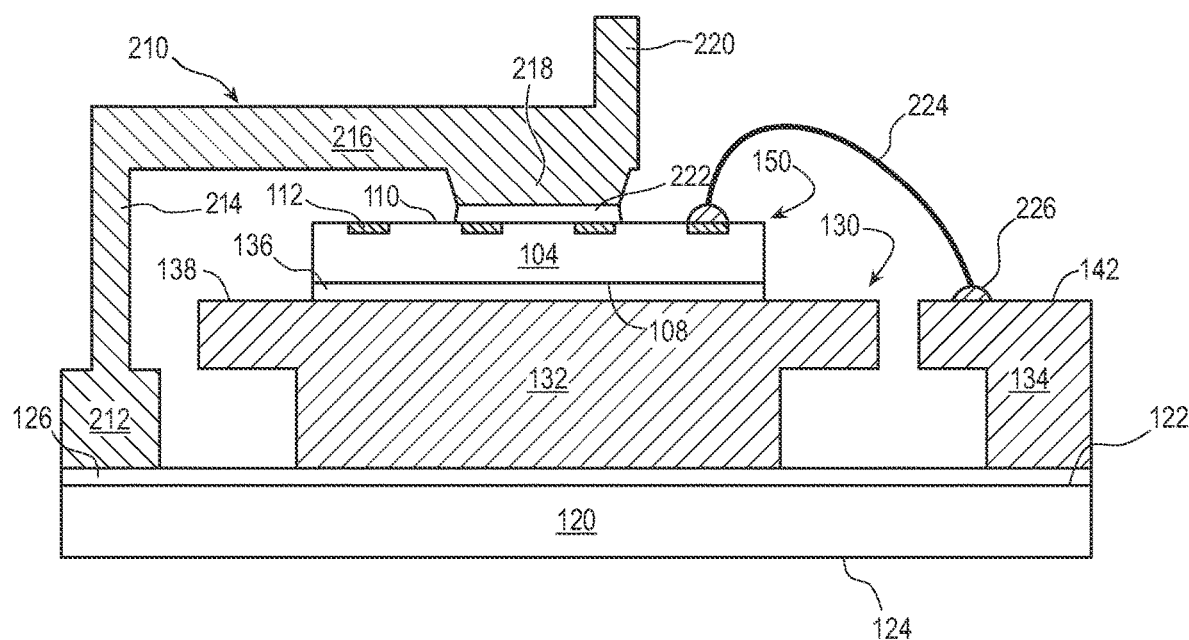

In another embodiment, continuing from FIG. 2e, clip bond 210 is positioned over substrate 120 and electrical component 150, as shown in FIG. 3a. Elements having a similar function are assigned the same reference number throughout the figures. Clip bond 210 includes first clip foot 212, vertical member 214, horizontal member 216, die contact 218 integrated with the horizontal member, and second clip foot 220. Clip bond 210 can be made with Au, Ag, Ni, Pt, Cu, Cu alloys (including one or more elements of nickel, iron, zinc, tin, chromium, silver, and phosphorous), or other suitable conductive materials. Clip bond 210 can be stamped, etched, or 3D laser printed into any shape corresponding to form and function. Clip bond 210 provides structural support and vertical and horizontal electrical interconnection for electrical component 150. Clip bond 210 is mounted to substrate 120 and electrical component 150, as shown in FIG. 3b. Clip foot 212 is secured to substrate 120 by the adhesive property of interface layer 126. Die contact 218 is mechanically and electrically connected to conductive layer 112 with conductive paste 222. Conductive paste 222 is cured to form a permanent mechanical and electrical connection between electrical component 150 and die contact 218. Bond wire 224 is connected between a portion of conductive layer 112 and lead finger 134 using solder paste 226 or other conductive paste on conductive layer 112 and surface 142 of lead finger 134. Any number of clip bonds 210 and bond wires 224 can be connected to electrical component 150, similar to FIG. 2h.

Figure 3C:
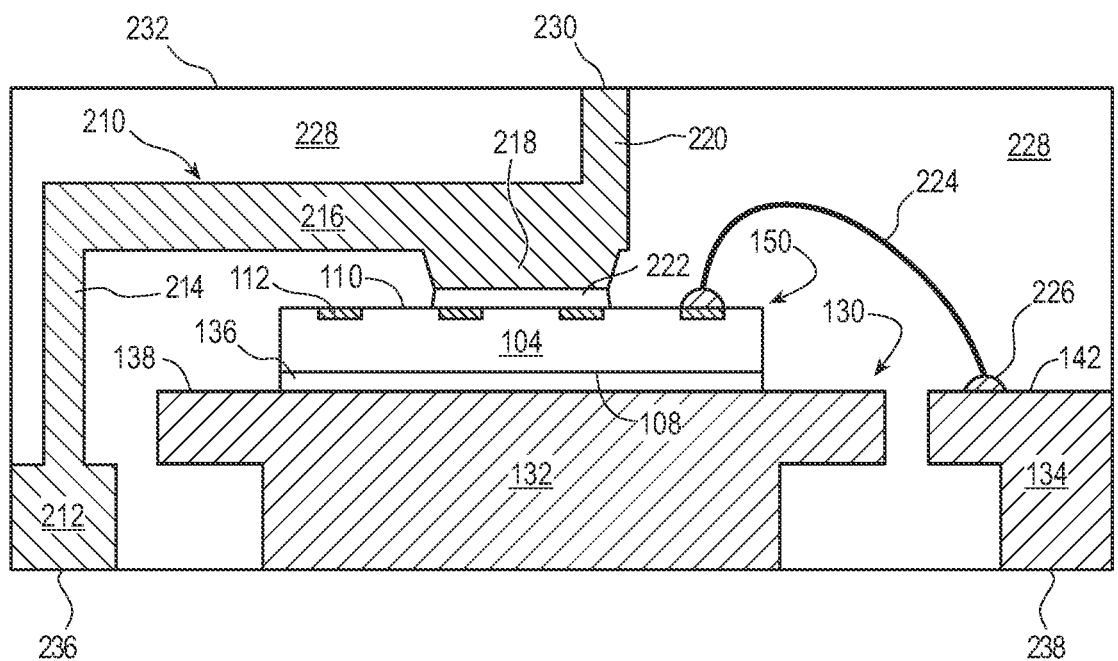

In FIG. 3c, encapsulant or molding compound 228 is deposited over and around clip bond 210, leadframe 130, and electrical component 150 using a paste printing, compressive molding, transfer molding, liquid encapsulant molding, vacuum lamination, spin coating, FAM, or other suitable applicator. Encapsulant 228 can be polymer composite material, such as epoxy resin with filler, epoxy acrylate with filler, or polymer with proper filler. Encapsulant 228 is non-conductive, provides structural support, and environmentally protects the semiconductor device from external elements and contaminants.

Figure 3D:
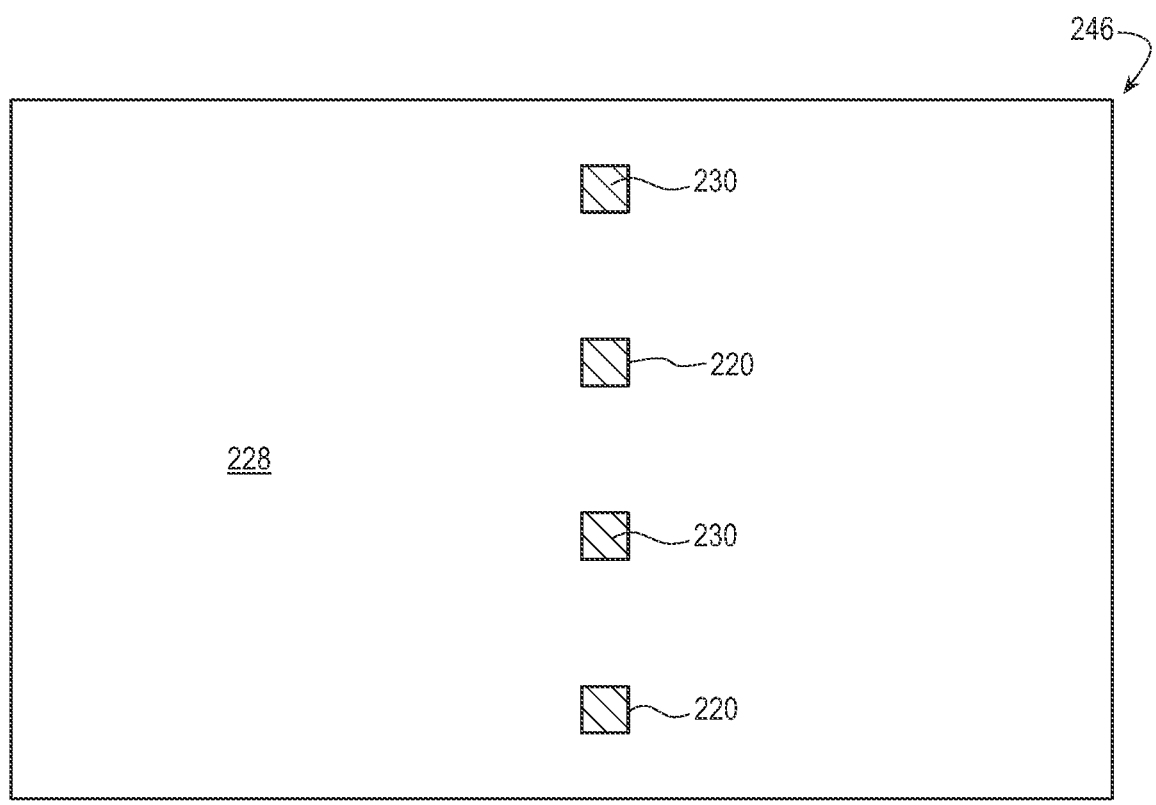

A portion of encapsulant 228 can be removed by grinder, similar to FIG. 2j, to expose surface 230 of clip foot 220 of clip bond 210 coplanar with surface 232 of encapsulant 228. The grinder planarizes surface 230 of clip foot 220 and surface 232 of encapsulant 228. Temporary substrate 120 and interface layer 126 are removed by chemical etching, mechanical peel-off, CMP, mechanical grinding, thermal bake, laser scanning, or wet stripping. Removing temporary substrate 120 exposes surface 236 of clip foot 212, as well as surface 238 of lead finger 134. FIG. 3d is a top view of surfaces 230 of clip foot 220 with encapsulant 228.

Figure 3E:
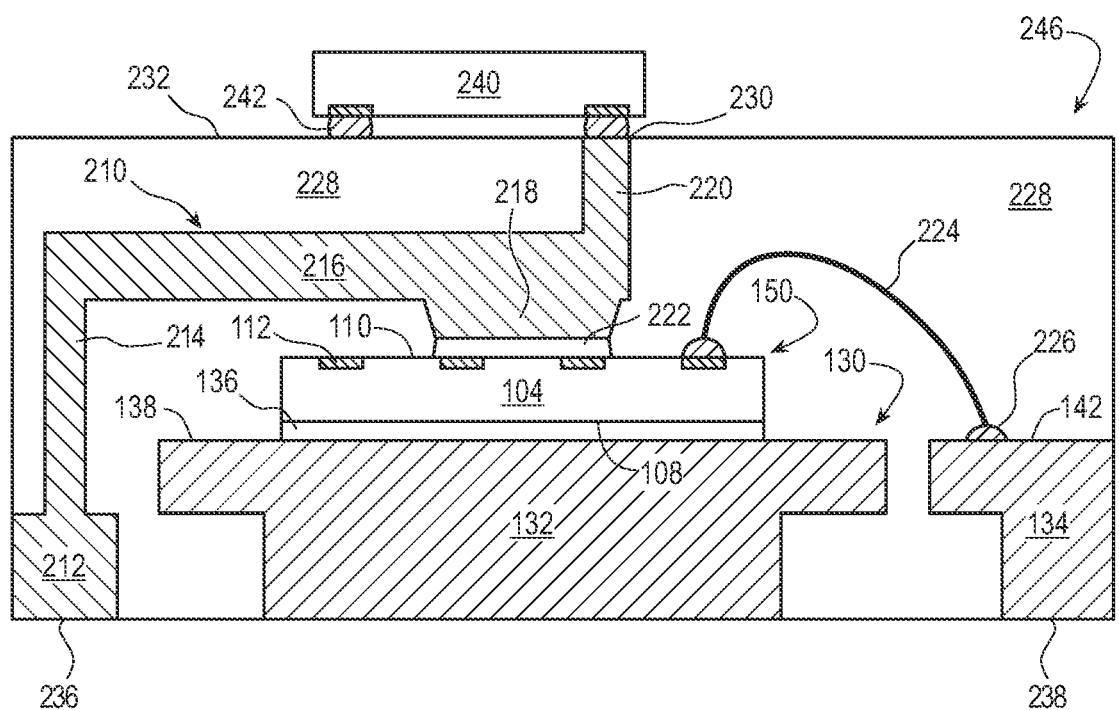

In FIG. 3e, electrical component 240 is positioned over surface 230 of clip foot 220 using a pick and place operation. Electrical component 240 can be made similar to semiconductor die 104 from FIG. 1c, with a different format and function, and bumps 242 oriented toward surface 230 of clip foot 220. Alternatively, electrical component 240 can include other semiconductor die, semiconductor package, surface mount device, discrete electrical device, discrete transistor, diode, or IPD. Electrical component 240 is mounted to clip foot 220 with bumps 242 making mechanical and electrical connection to surface 230 and possibly other portions of the clip bond.

Semiconductor package 246 provides more interconnect flexibility to electrical component 150 with both clip bonds 210 and bond wires 224. Semiconductor package 246 provides vertical and horizontal electrical interconnect capability with clip bond 210 having exposed electrical connectivity on the top surface and bottom surface of the package. Semiconductor package 246 enables direct connection between multiple components, reduces conductive path length and electrical resistance to increase product performance, provides more power efficiency in high power applications and reduces footprint of the package for application to PCB. Semiconductor package 246 provides for device stacking, e.g., with electrical component 240.

Figure 4A:
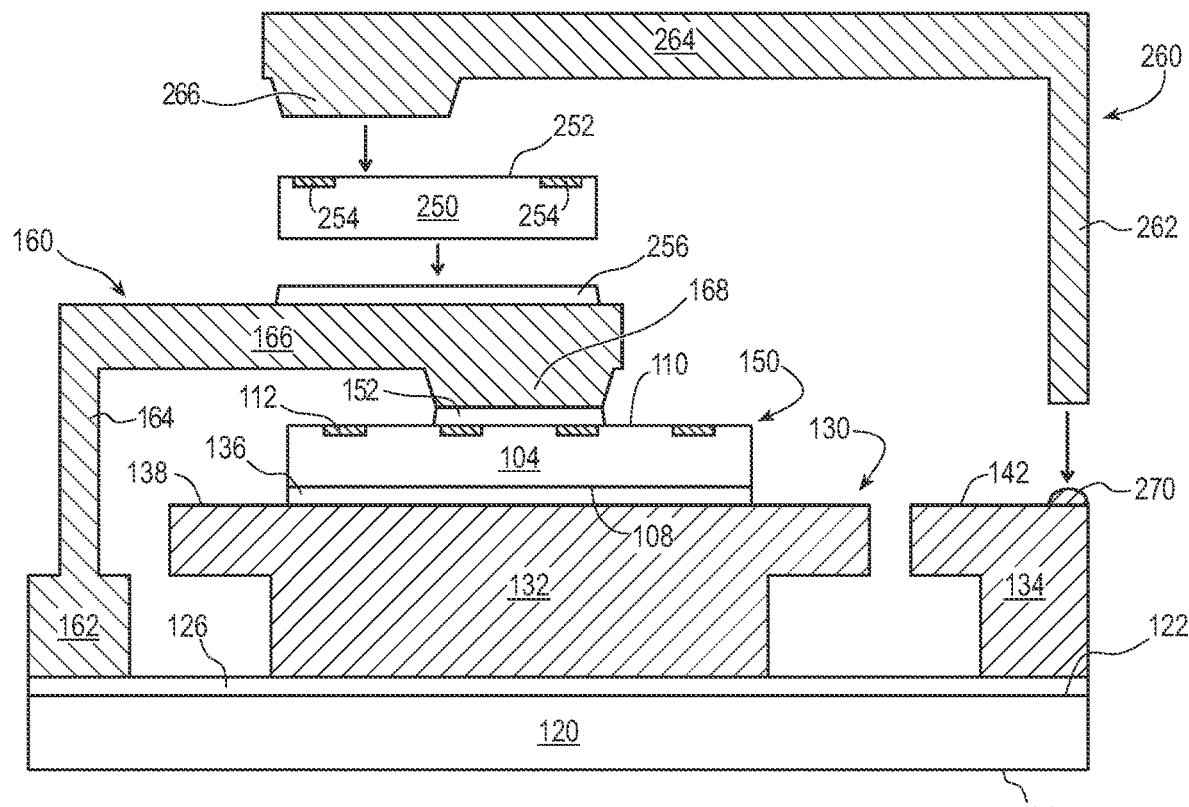
FIGS. 4a-4f illustrate a third embodiment of the leadframe and clip bond.

In another embodiment, continuing from FIG. 2g, electrical component 250 is positioned over horizontal member 166 of clip bond 160 using a pick and place operation, as shown in FIG. 4a. Electrical component 250 can be made similar to semiconductor die 104 from FIG. 1c, with a different format and function, and active surface 252 oriented away from horizontal member 166. Alternatively, electrical component 250 can include other semiconductor die, semiconductor package, surface mount device, discrete electrical device, discrete transistor, diode, or IPD.

Figure 4B:
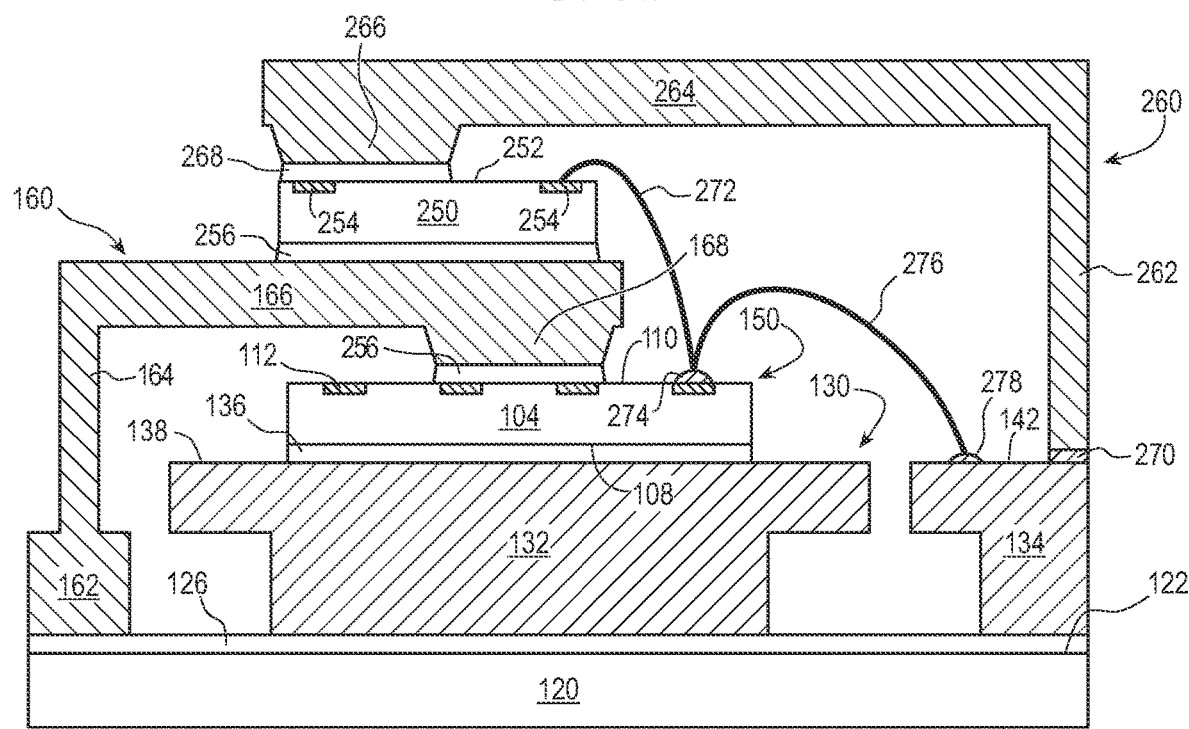

Clip bond 260 includes vertical member 262, horizontal member 264, and die contact 266 integrated with the horizontal member. Clip bond 260 can be made with Au, Ag, Ni, Pt, Cu, Cu alloys (including one or more elements of nickel, iron, zinc, tin, chromium, silver, and phosphorous), or other suitable conductive materials. Clip bond 260 can be stamped, etched, or 3D laser printed into any shape corresponding to form and function. Clip bond 260 provides structural support and vertical and horizontal electrical interconnection for electrical components 150 and 250. FIG. 4b shows electrical component 250 mounted to horizontal member 166 of clip bond 160 with adhesive 256. Die contact 266 is mechanically and electrically connected to conductive layer 254 of electrical component 250 with conductive paste 268. Conductive paste 268 is cured to form a permanent mechanical and electrical connection between electrical component 260 and die contact 266. Vertical member 262 is mechanically and electrically connected to lead finger 134 with solder paste 270 or other conductive paste. Electrical component 250 can be positioned at a different level or the same level as electrical component 150. Bond wire 272 is connected between a portion of conductive layer 254 and a portion of conductive layer 112 with solder paste 274 or other conductive paste. Bond wire 276 is connected between a portion of conductive layer 112 and lead finger 134 using solder paste 278 or other conductive paste on conductive layer 112 and surface 142 of lead finger 134. Any number of clip bonds 160 and 260 and bond wires 272-276 can be connected to electrical components 150 and 250, similar to FIG. 2h.

Figure 4C:
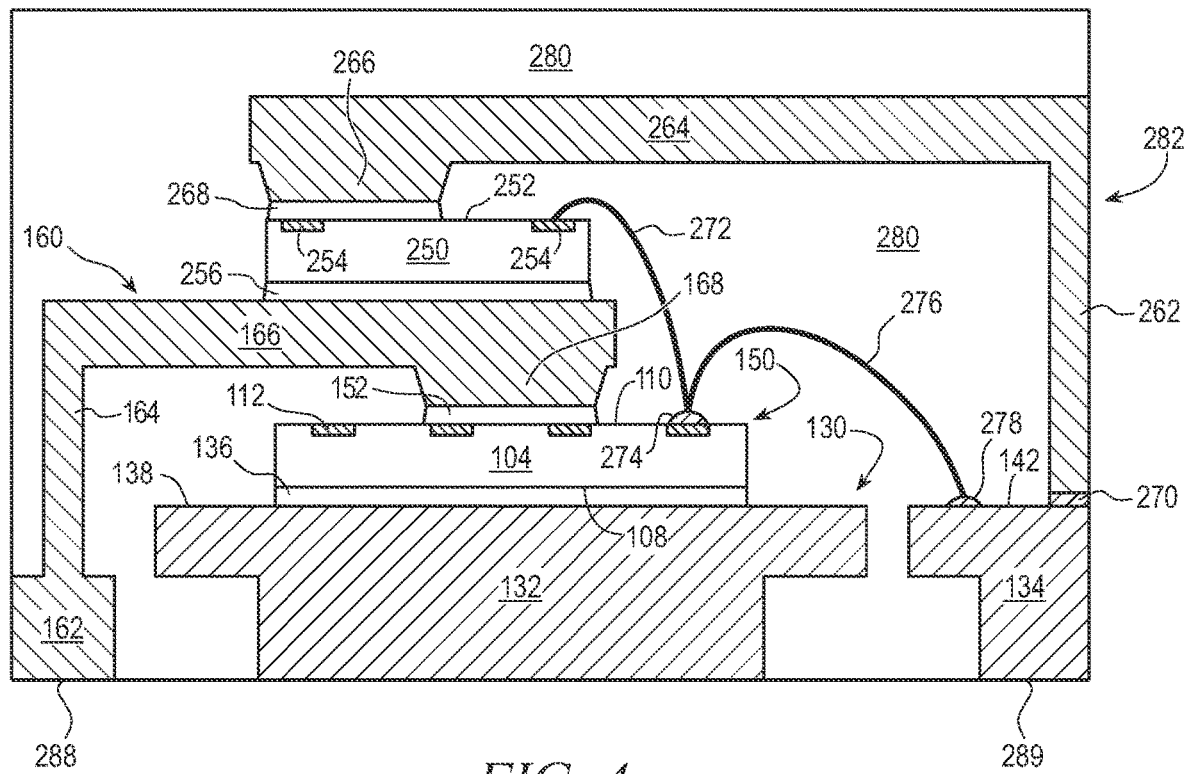

In FIG. 4c, encapsulant or molding compound 280 is deposited over and around clip bond 260, clip bond 160, leadframe 130, and electrical components 150 and 250 using a paste printing, compressive molding, transfer molding, liquid encapsulant molding, vacuum lamination, spin coating, FAM, or other suitable applicator. Encapsulant 280 can be polymer composite material, such as epoxy resin with filler, epoxy acrylate with filler, or polymer with proper filler. Encapsulant 280 is non-conductive, provides structural support, and environmentally protects the semiconductor device from external elements and contaminants. In one embodiment, semiconductor package 282 is complete with clip bond 260 embedded within encapsulant 280, as shown in FIG. 4c.

Figure 4D:
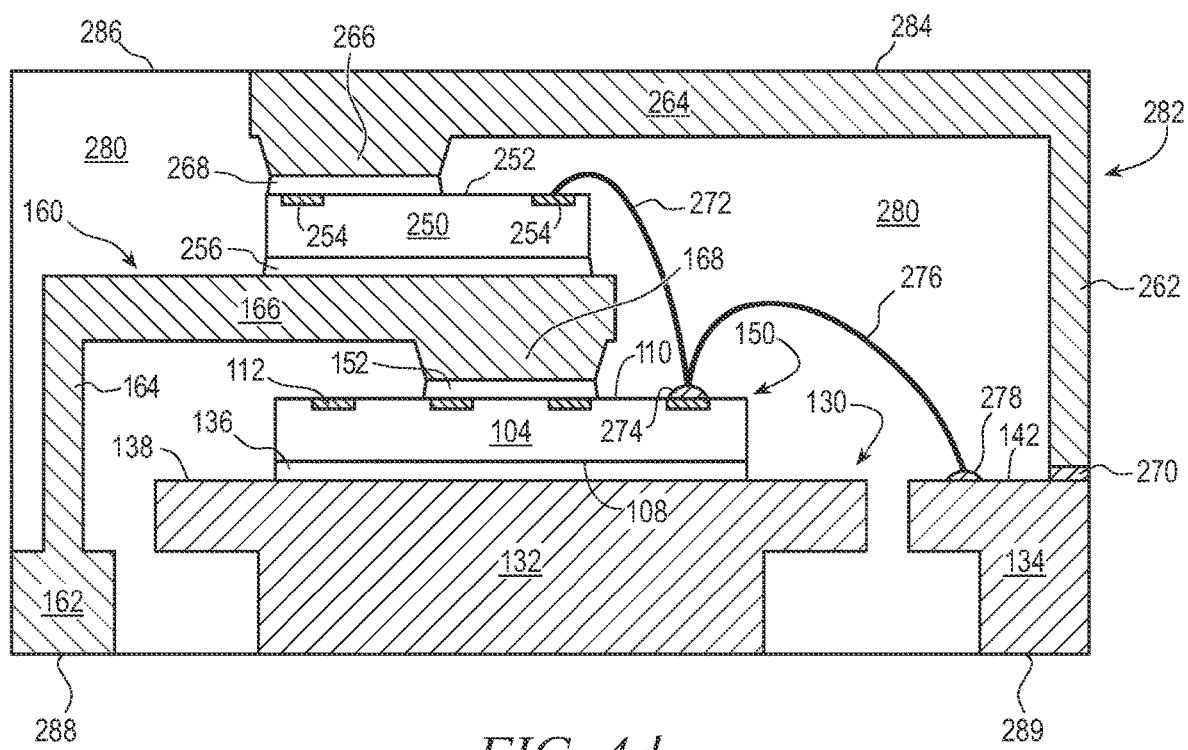
Figure 4E:
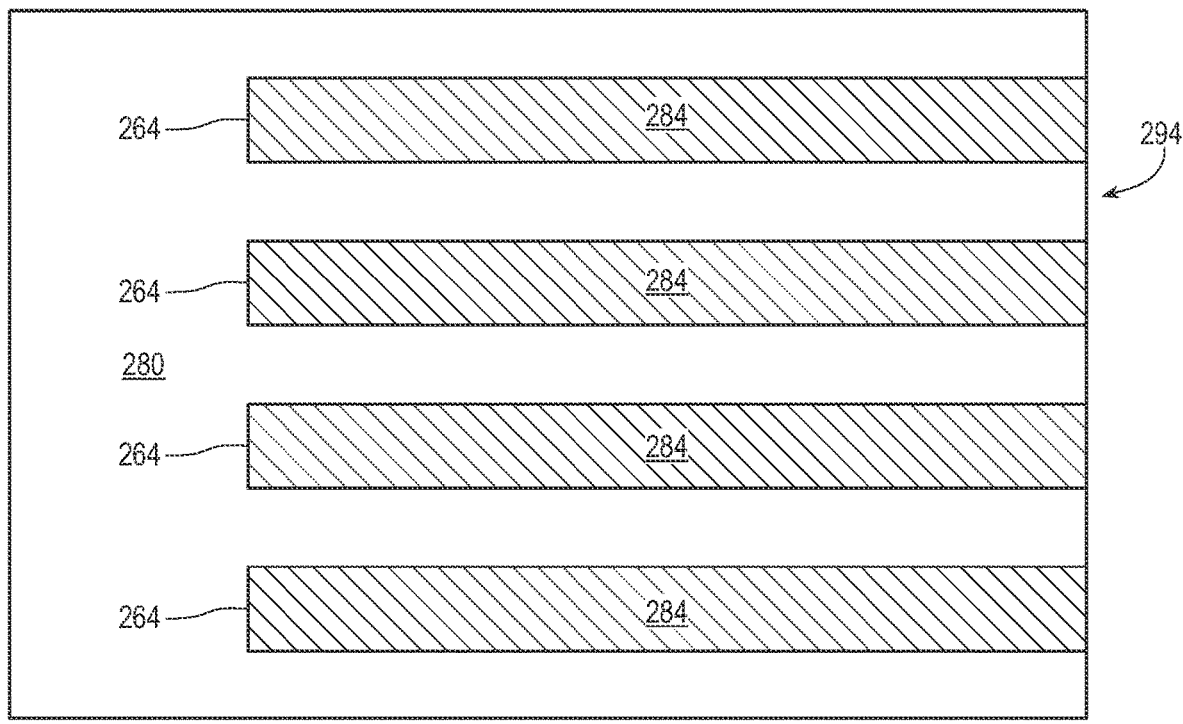

Alternatively, a portion of encapsulant 280 can be removed by grinder, similar to FIG. 2j, to expose surface 284 of horizontal member 264 of clip bond 260 coplanar with surface 286 of encapsulant 280, as shown in FIG. 4d. The grinder planarizes surface 284 of horizontal member 264 and surface 286 of encapsulant 280. Temporary substrate 120 and interface layer 126 are removed by chemical etching, mechanical peel-off, CMP, mechanical grinding, thermal bake, laser scanning, or wet stripping. Removing temporary substrate 120 exposes surface 288 of clip foot 162, as well as surface 289 of lead finger 134. FIG. 4e is a top view of surfaces 284 of horizontal members 264 of clip bonds 260 with encapsulant 280.

Figure 4F:
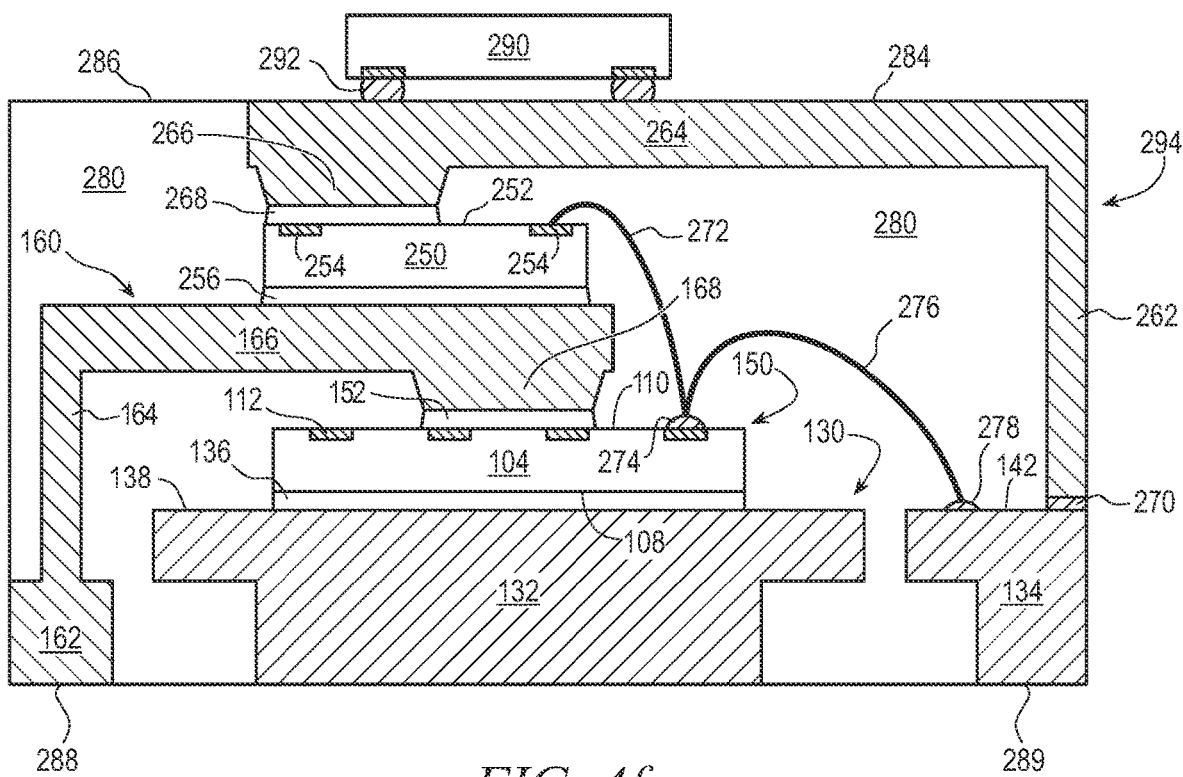

In FIG. 4f, electrical component 290 is positioned over surface 284 of clip bond 260 using a pick and place operation. Electrical component 290 can be made similar to semiconductor die 104 from FIG. 1c, with a different format and function, and bumps 292 oriented toward surface 284 of clip bond 260. Alternatively, electrical component 290 can include other semiconductor die, semiconductor package, surface mount device, discrete electrical device, discrete transistor, diode, or IPD. Electrical component 290 is mounted to horizontal member 264 of clip bond 260 with bumps 292 making mechanical and electrical connection to surface 284 and possibly other portions of the clip bond.

Semiconductor package 294 provides more interconnect flexibility to electrical components 150 and 250 with both clip bonds 160 and 260 and bond wires 272 and 276. Semiconductor package 294 provides vertical and horizontal electrical interconnect capability with clip bonds 160 and 260 having exposed electrical connectivity on the top surface and bottom surface of the package, while supporting stacked electrical components 150 and 250. Semiconductor package 294 enables direct connection between multiple components, reduces conductive path length and electrical resistance to increase product performance, provides more power efficiency in high power applications and reduces footprint of the package for application to PCB. Semiconductor package 294 provides for device stacking, e.g., with electrical component 290.

Figure 5A:
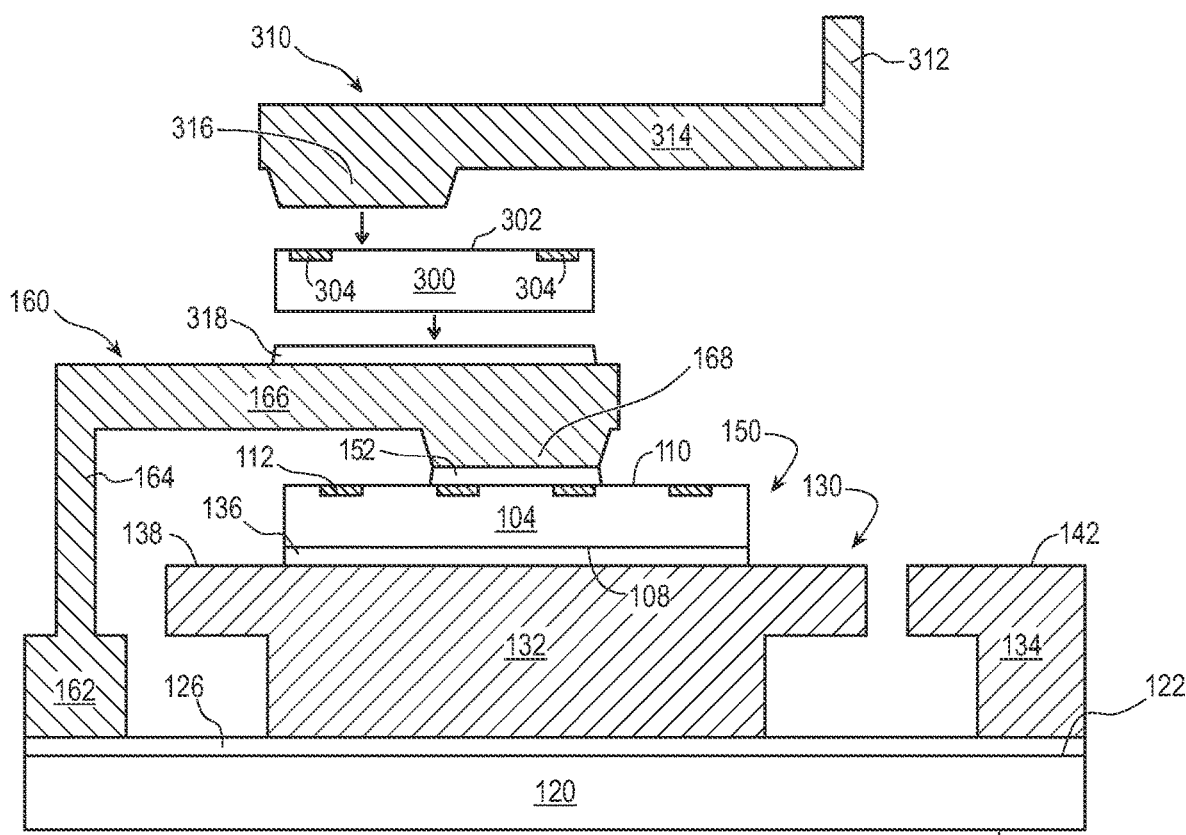
FIGS. 5a-5e illustrate a fourth embodiment of the leadframe and clip bond.

In another embodiment, continuing from FIG. 2g, electrical component 300 is positioned over horizontal member 166 of clip bond 160 using a pick and place operation, as shown in FIG. 5a. Electrical component 300 can be made similar to semiconductor die 104 from FIG. 1c, with a different format and function, and active surface 302 oriented away from horizontal member 166. Alternatively, electrical component 300 can include other semiconductor die, semiconductor package, surface mount device, discrete electrical device, discrete transistor, diode, or IPD.

Figure 5B:
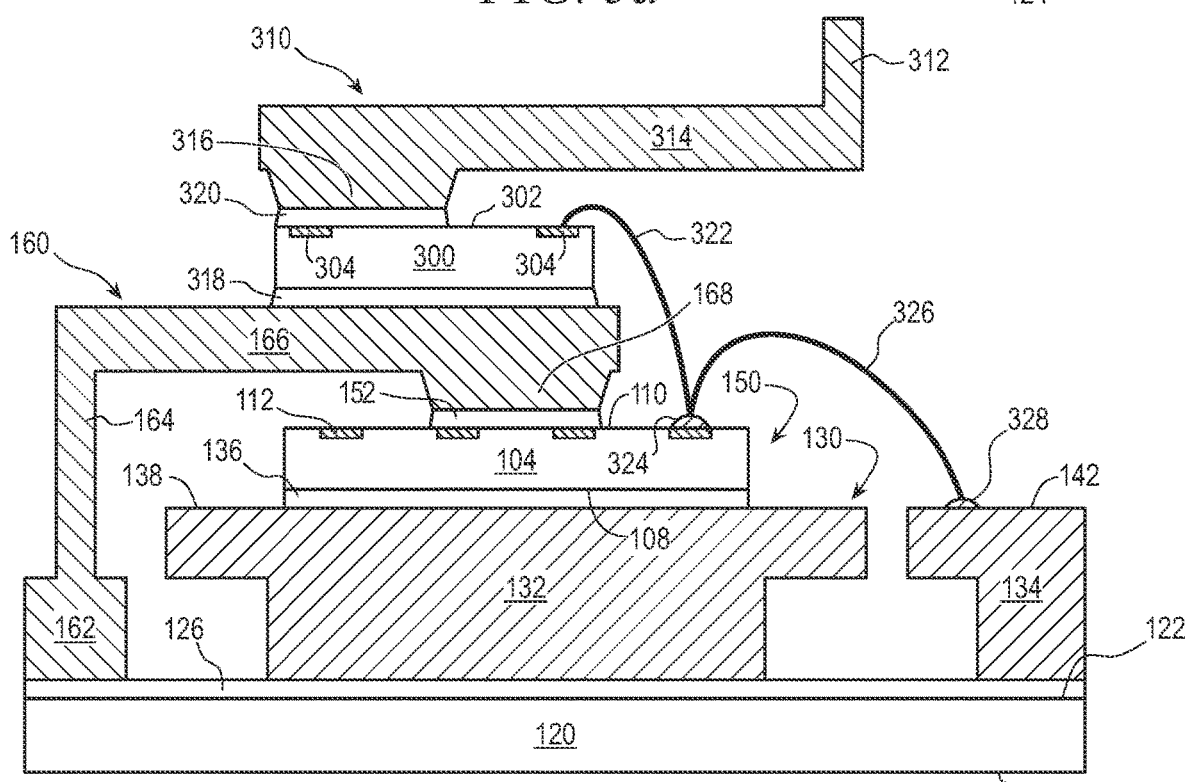

Clip bond 310 includes clip foot 312, horizontal member 314, and die contact 316. Clip bond 310 can be made with Au, Ag, Ni, Pt, Cu, Cu alloys (including one or more elements of nickel, iron, zinc, tin, chromium, silver, and phosphorous), or other suitable conductive materials. Clip bond 310 can be stamped, etched, or 3D laser printed into any shape corresponding to form and function. Clip bond 310 provides structural support and vertical and horizontal electrical interconnection for electrical components 150 and 300. FIG. 5b shows electrical component 300 mounted to horizontal member 166 of clip bond 160 with adhesive 318. Die contact 316 is mechanically and electrically connected to conductive layer 304 of electrical component 300 with conductive paste 320. Conductive paste 320 is cured to form a permanent mechanical and electrical connection between electrical component 300 and die contact 316 integrated with the horizontal member. Electrical component 300 can be positioned at a different level or the same level as electrical component 150. Bond wire 322 is connected between a portion of conductive layer 304 and a portion of conductive layer 112 with solder paste 324 or other conductive paste. Bond wire 326 is connected between a portion of conductive layer 112 and lead finger 134 using solder paste 328 or other conductive paste on conductive layer 112 and surface 142 of lead finger 134. Any number of clip bonds 160 and 310 and bond wires 322-326 can be connected to electrical components 150 and 300, similar to FIG. 2h.

Figure 5C:
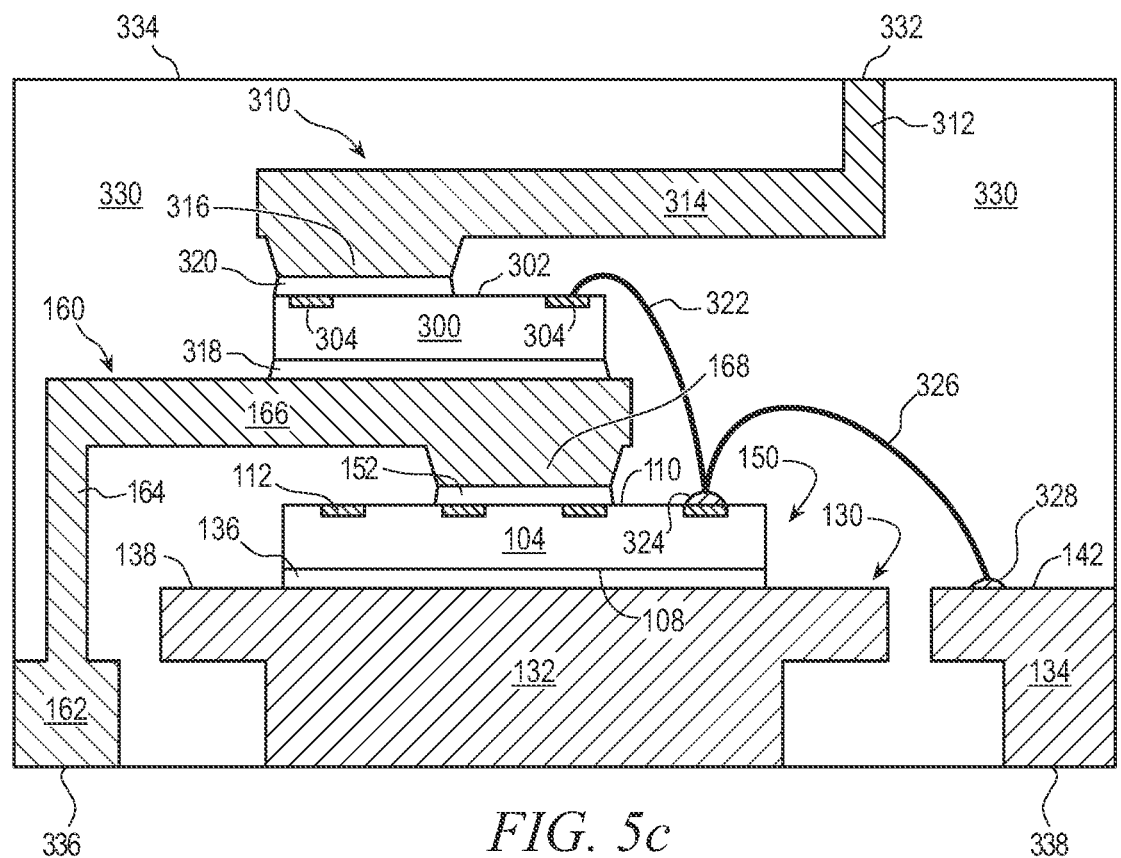

In FIG. 5c, encapsulant or molding compound 330 is deposited over and around clip bond 310, clip bond 160, leadframe 130, and electrical components 150 and 300 using a paste printing, compressive molding, transfer molding, liquid encapsulant molding, vacuum lamination, spin coating, FAM, or other suitable applicator. Encapsulant 330 can be polymer composite material, such as epoxy resin with filler, epoxy acrylate with filler, or polymer with proper filler. Encapsulant 330 is non-conductive, provides structural support, and environmentally protects the semiconductor device from external elements and contaminants.

Figure 5D:
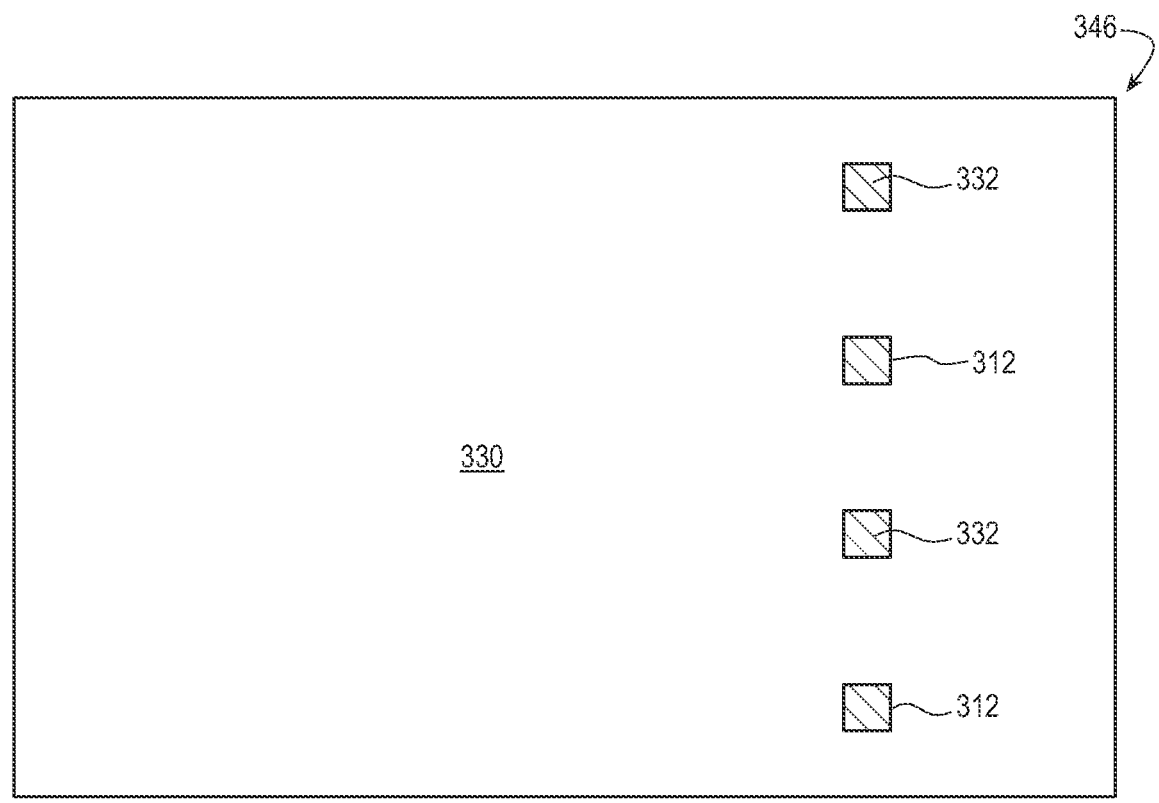

A portion of encapsulant 330 can be removed by grinder, similar to FIG. 2j, to expose surface 332 of clip foot 312 of clip bond 310 coplanar with surface 334 of encapsulant 330. The grinder planarizes surface 332 of clip foot 312 and surface 334 of encapsulant 330. Temporary substrate 120 and interface layer 126 are removed by chemical etching, mechanical peel-off, CMP, mechanical grinding, thermal bake, laser scanning, or wet stripping. Removing temporary substrate 120 exposes surface 336 of clip foot 162, as well as surface 338 of lead finger 134. FIG. 5d is a top view of surface 332 of clip foot 312 with encapsulant 330.

Figure 5E:
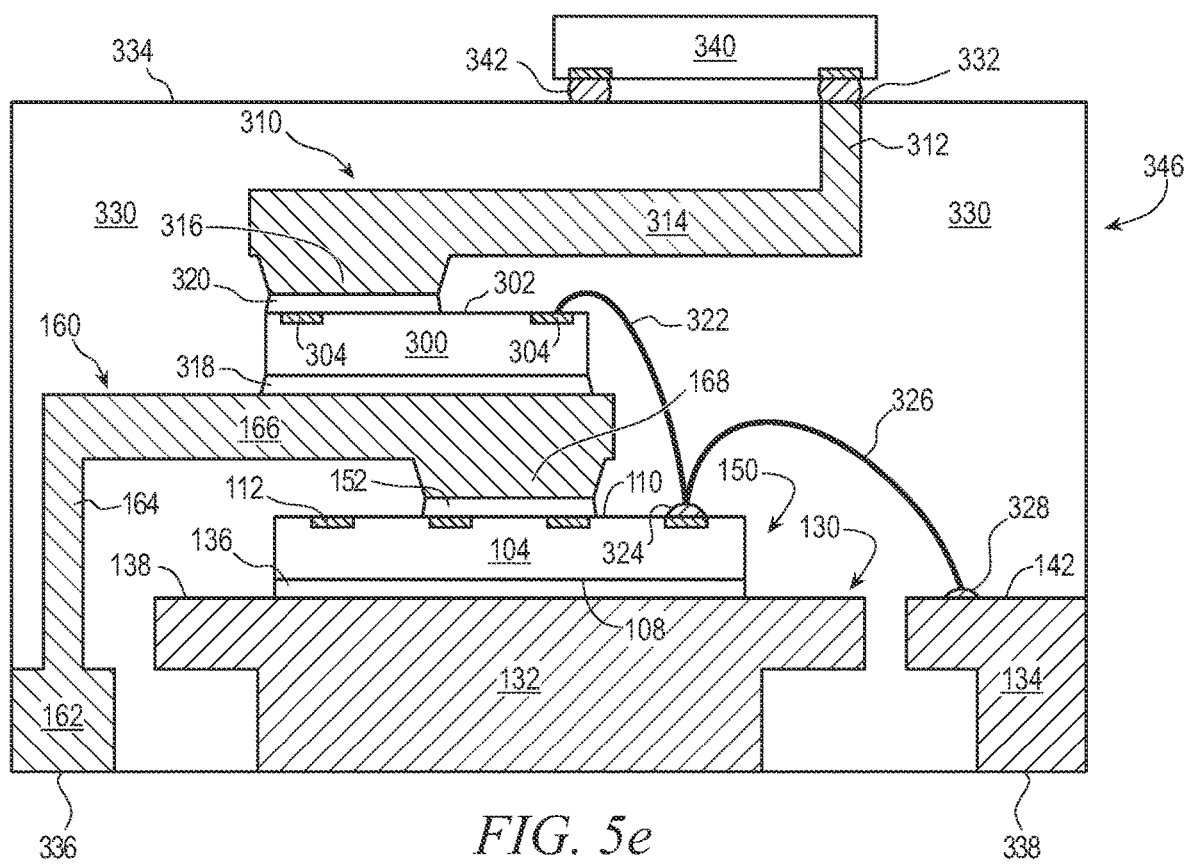

In FIG. 5e, electrical component 340 is positioned over surface 332 of clip foot 312 using a pick and place operation. Electrical component 340 can be made similar to semiconductor die 104 from FIG. 1c, with a different format and function, and bumps 342 oriented toward surface 332 of clip foot 312. Alternatively, electrical component 340 can include other semiconductor die, semiconductor package, surface mount device, discrete electrical device, discrete transistor, diode, or IPD. Electrical component 340 is mounted to clip foot 312 of clip bond 310 with bumps 342 making mechanical and electrical connection to surface 332 and possibly other portions of the clip bond.

Semiconductor package 346 provides more interconnect flexibility to electrical components 150 and 300 with both clip bonds 160 and 310 and bond wires 322 and 326. Semiconductor package 346 provides vertical and horizontal electrical interconnect capability with clip bond 160 and 310 having exposed electrical connectivity on the top surface and bottom surface of the package, while supporting stacked electrical components 150 and 360. Semiconductor package 346 enables direct connection between multiple components, reduces conductive path length and electrical resistance to increase product performance, provides more power efficiency in high power applications and reduces footprint of the package for application to PCB. Semiconductor package 346 provides for device stacking, e.g., with electrical component 340.

Figure 6A:
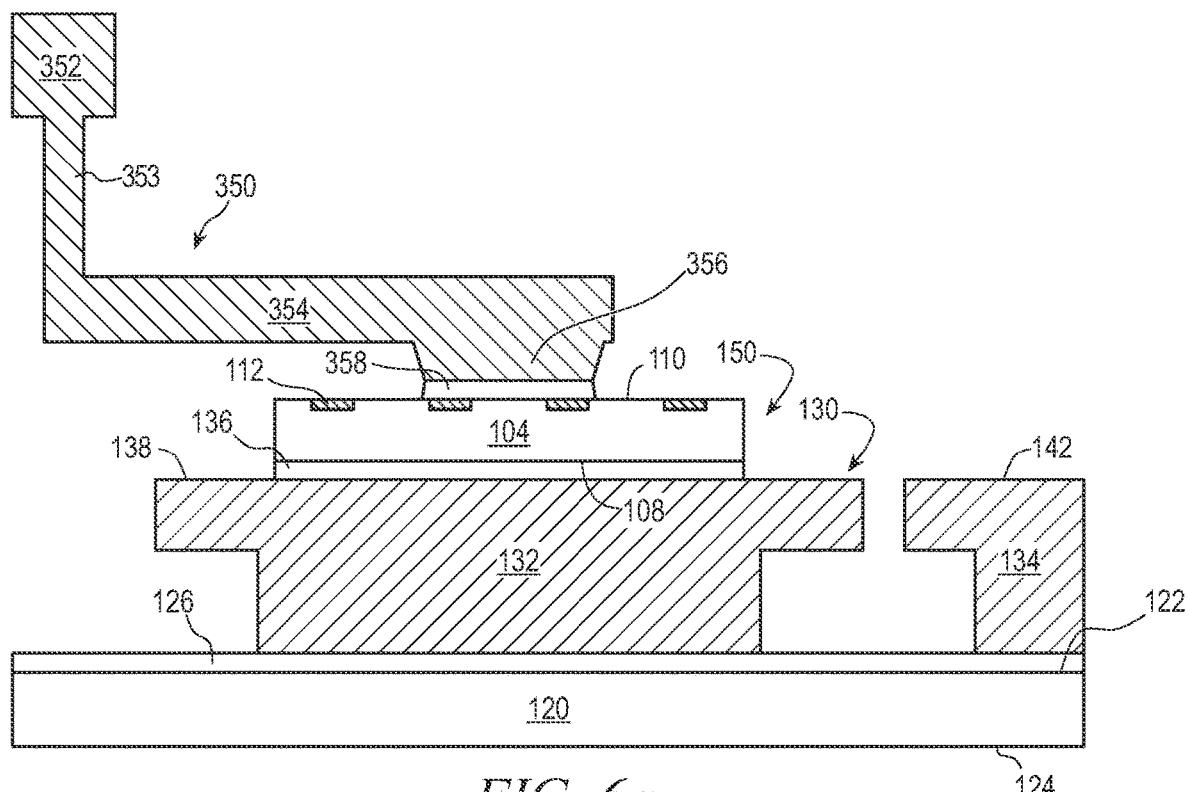
FIGS. 6a-6e illustrate a fifth embodiment of the leadframe and clip bond.

In another embodiment, continuing from FIG. 2e, clip bond 350 is positioned over and mounted to electrical component 150, as shown in FIG. 6a. Clip bond 350 includes clip foot 352, vertical member 353, horizontal member 354, and die contact 356. Clip bond 350 can be made with Au, Ag, Ni, Pt, Cu, Cu alloys (including one or more elements of nickel, iron, zinc, tin, chromium, silver, and phosphorous), or other suitable conductive materials. Clip bond 350 can be stamped, etched, or 3D laser printed into any shape corresponding to form and function. Clip bond 350 provides structural support and vertical and horizontal electrical interconnection for electrical component 150. Die contact 356 is mechanically and electrically connected to conductive layer 112 with conductive paste 358. Conductive paste 358 is cured to form a permanent mechanical and electrical connection between electrical component 150 and die contact 356.

Figure 6B:
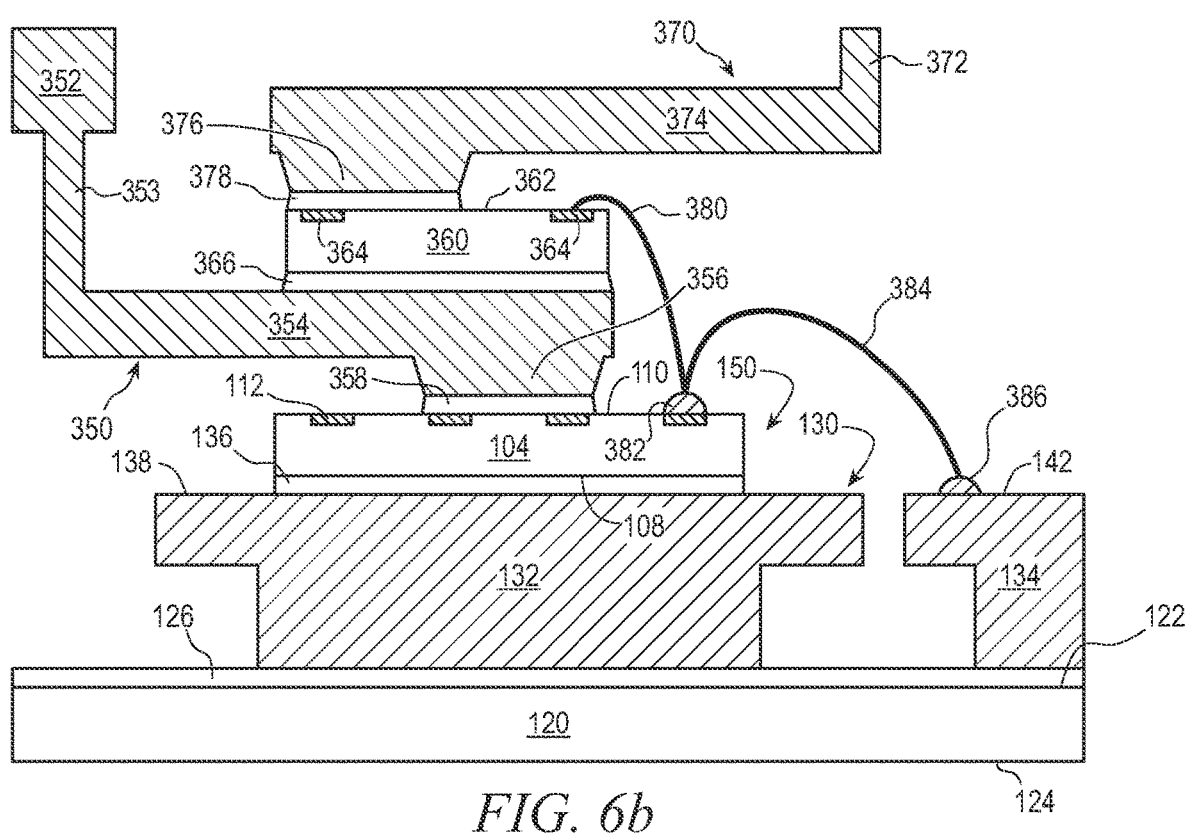

In FIG. 6b, electrical component 360 is positioned over and mounted to horizontal member 354 of clip bond 350 using a pick and place operation. Electrical component 360 can be made similar to semiconductor die 104 from FIG. 1c, with a different format and function, and active surface 362 oriented away from horizontal member 354. Alternatively, electrical component 360 can include other semiconductor die, semiconductor package, surface mount device, discrete electrical device, discrete transistor, diode, or IPD. Electrical component 360 is bonded to horizontal member 354 of clip bond 350 with adhesive 366. Electrical component 360 can be positioned at a different level or the same level as electrical component 150.

Clip bond 370 includes clip foot 372, horizontal member 374, and die contact 376 integrated with the horizontal member. Clip bond 370 can be made with Au, Ag, Ni, Pt, Cu, Cu alloys (including one or more elements of nickel, iron, zinc, tin, chromium, silver, and phosphorous), or other suitable conductive materials. Clip bond 370 can be stamped, etched, or 3D laser printed into any shape corresponding to form and function. Clip bond 370 provides structural support and vertical and horizontal electrical interconnection for electrical components 150 and 360. Die contact 376 is mechanically and electrically connected to conductive layer 364 of electrical component 360 with conductive paste 378. Conductive paste 378 is cured to form a permanent mechanical and electrical connection between electrical component 360 and die contact 376. Bond wire 380 is connected between a portion of conductive layer 364 and a portion of conductive layer 112 with solder paste 382 or other conductive paste. Bond wire 384 is connected between a portion of conductive layer 112 and lead finger 134 using solder paste 386 or other conductive paste on conductive layer 112 and surface 142 of lead finger 134. Any number of clip bonds 350 and 370 and bond wires 380-384 can be connected to electrical components 150 and 360, similar to FIG. 2h.

Figure 6C:
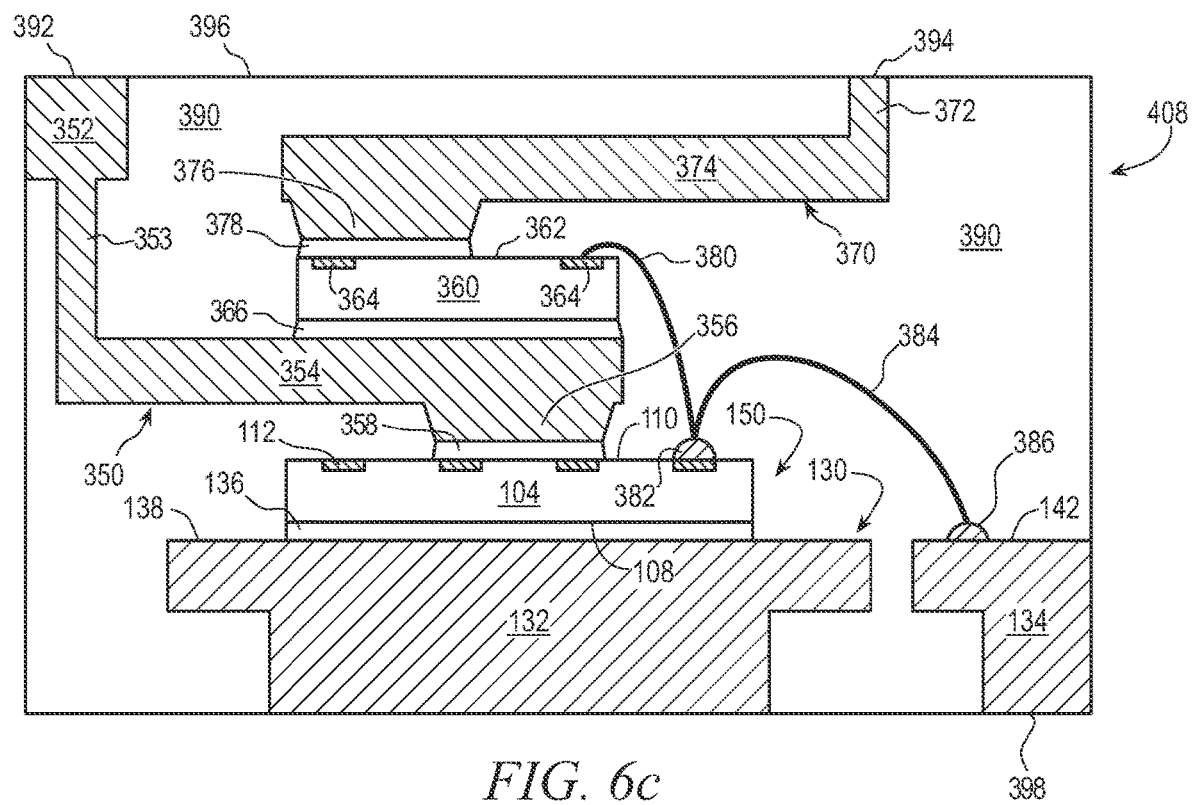

In FIG. 6c, encapsulant or molding compound 390 is deposited over and around clip bond 350, clip bond 370, leadframe 130, and electrical components 150 and 360 using a paste printing, compressive molding, transfer molding, liquid encapsulant molding, vacuum lamination, spin coating, FAM, or other suitable applicator. Encapsulant 390 can be polymer composite material, such as epoxy resin with filler, epoxy acrylate with filler, or polymer with proper filler. Encapsulant 390 is non-conductive, provides structural support, and environmentally protects the semiconductor device from external elements and contaminants.

Figure 6D:
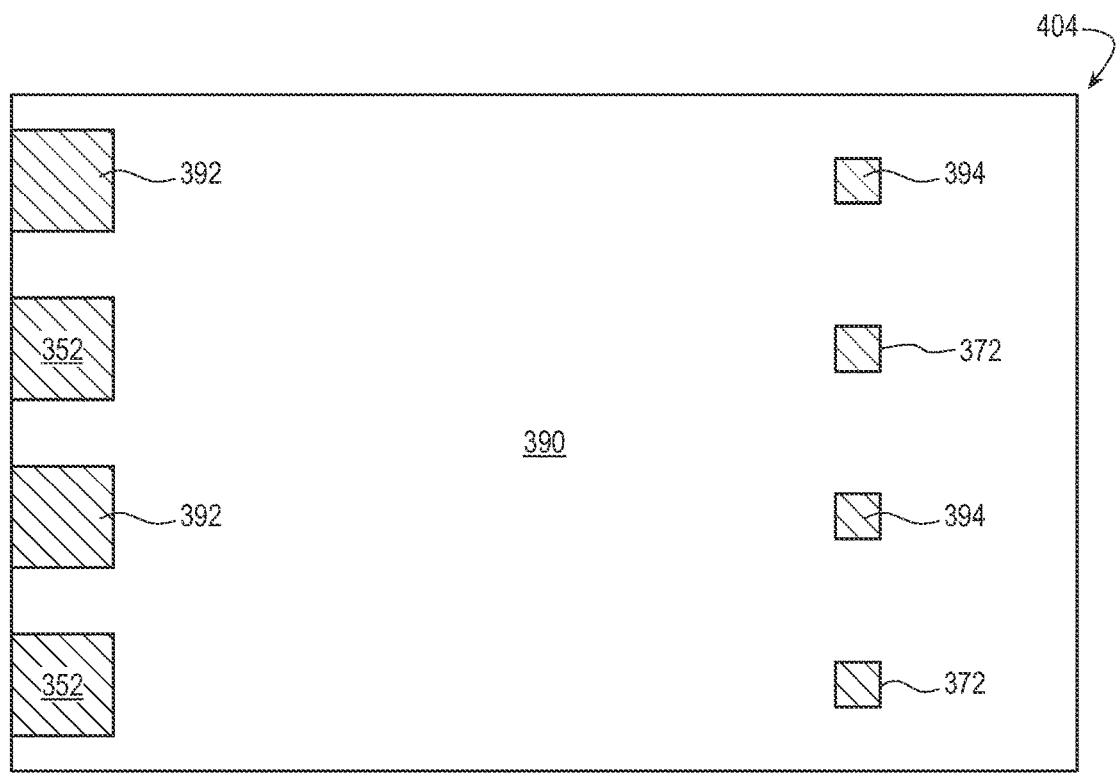

A portion of encapsulant 390 can be removed by grinder, similar to FIG. 2j, to expose surface 392 of clip foot 352 of clip bond 350 and surface 394 of clip foot 372 of clip bond 370 coplanar with surface 396 of encapsulant 390. The grinder planarizes surface 392 of clip foot 352 and surface 394 of clip foot 372 and surface 396 of encapsulant 390. Temporary substrate 120 and interface layer 126 are removed by chemical etching, mechanical peel-off, CMP, mechanical grinding, thermal bake, laser scanning, or wet stripping. Removing temporary substrate 120 exposes surface 398 of lead finger 134. FIG. 6d is a top view of surface 392 of clip foot 352 and surface 394 of clip foot 372 with encapsulant 390.

Figure 6E:
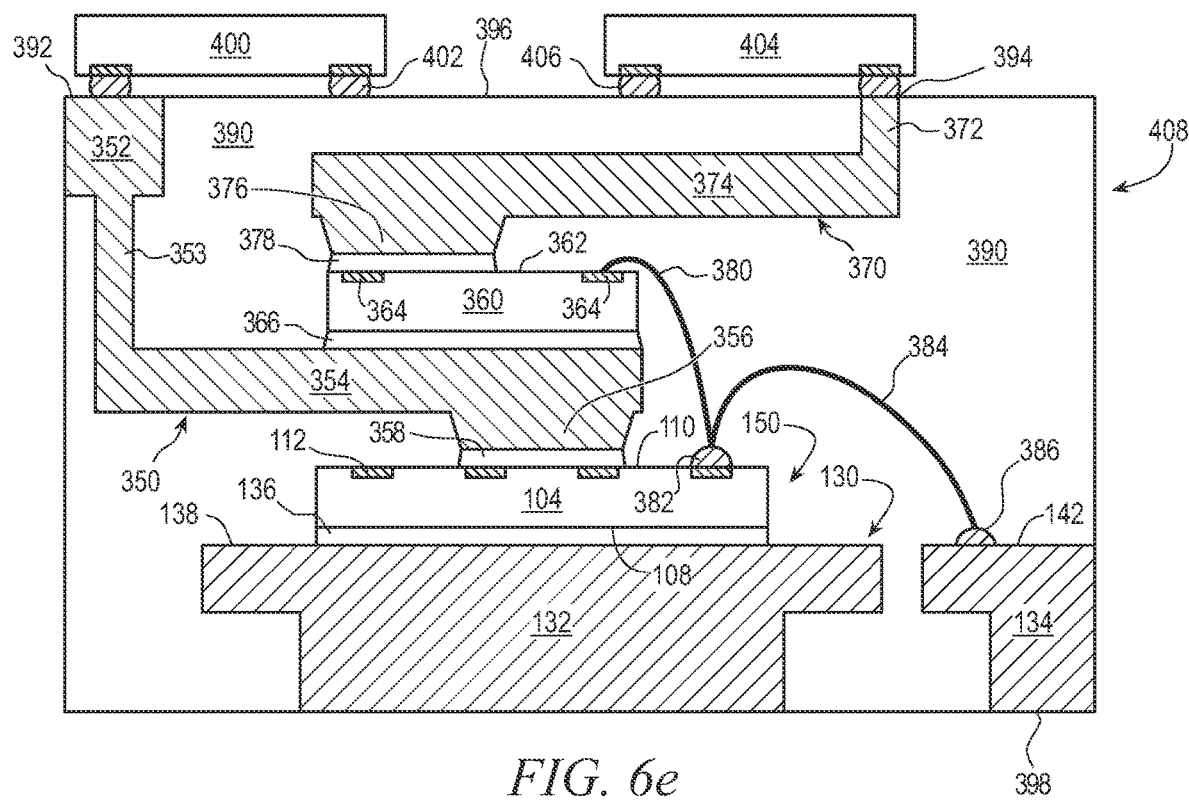

In FIG. 6e, electrical component 400 is positioned over surface 392 of clip foot 352 using a pick and place operation. Electrical component 400 can be made similar to semiconductor die 104 from FIG. 1c, with a different format and function, and bumps 402 oriented toward surface 392 of clip foot 352. Alternatively, electrical component 400 can include other semiconductor die, semiconductor package, surface mount device, discrete electrical device, discrete transistor, diode, or IPD. Electrical component 400 is mounted to clip foot 352 of clip bond 350 with bumps 402 making mechanical and electrical connection to surface 392 and possibly other portions of the clip bond.

Electrical component 404 is positioned over surface 394 of clip foot 372 using a pick and place operation. Electrical component 404 can be made similar to semiconductor die 104 from FIG. 1c, with a different format and function, and bumps 406 oriented toward surface 394 of clip foot 372. Alternatively, electrical component 400 can include other semiconductor die, semiconductor package, surface mount device, discrete electrical device, discrete transistor, diode, or IPD. Electrical component 404 is mounted to clip foot 372 of clip bond 370 with bumps 406 making mechanical and electrical connection to surface 394 and possibly other portions of the clip bond.

Semiconductor package 408 provides more interconnect flexibility to electrical components 150 and 360 with both clip bonds 350 and 370 and bond wires 380 and 384. Semiconductor package 408 provides vertical and horizontal electrical interconnect capability with clip bond 350 and 370 having exposed electrical connectivity on the top surface of the package, while supporting stacked electrical components 150 and 360. Semiconductor package 408 enables direct connection between multiple components, reduces conductive path length and electrical resistance to increase product performance, provides more power efficiency in high power applications and reduces footprint of the package for application to PCB. Semiconductor package 408 provides for device stacking, e.g., with electrical components 400 and 404.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a leadframe;
a first electrical component including a first surface disposed on the leadframe; and
a clip bond disposed over a second surface of the first electrical component opposite the first surface of the first electrical component, wherein the clip bond extends vertically from a first surface of the semiconductor device to a second surface of the semiconductor device opposite the leadframe with a horizontal member disposed over the second surface of the first electrical component and a first vertical member extending from the horizontal member and exposed from the second surface of the semiconductor device.

2. The semiconductor device of claim 1, wherein the clip bond further includes:
a second vertical member extending from the horizontal member and exposed from the first surface of the semiconductor device; and
a die contact integrated with the horizontal member over the first electrical component.

3. The semiconductor device of claim 2, wherein the second vertical member includes a clip foot exposed from the first surface of the semiconductor device.

4. The semiconductor device of claim 1, further including an encapsulant deposited around the first electrical component and clip bond.

5. The semiconductor device of claim 4, further including a second electrical component disposed over the encapsulant.

6. The semiconductor device of claim 1, further including a bond wire coupled between the first electrical component and leadframe.

7. A semiconductor device, comprising:
   a leadframe, wherein a portion of the leadframe is exposed from a first surface of the semiconductor device;
   a first electrical component disposed on the leadframe; and
   a clip bond including a horizontal member disposed over a second surface of the first electrical component and a first vertical member extending from the horizontal member and exposed from a second surface of the semiconductor device opposite the first surface of the semiconductor device, wherein the clip bond includes,
   (a) a second vertical member extending from the horizontal member and exposed from the first surface of the semiconductor device, and
   (b) a die contact integrated with the horizontal member over the first electrical component.

8. The semiconductor device of claim 7, wherein the second vertical member includes a clip foot exposed from the first surface of the semiconductor device.

9. The semiconductor device of claim 7, further including an encapsulant deposited around the first electrical component and clip bond.

10. The semiconductor device of claim 9, further including a second electrical component disposed over the encapsulant.

11. The semiconductor device of claim 7, further including a bond wire coupled between the first electrical component and leadframe.

12. A method of making a semiconductor device, comprising:
   providing a leadframe;
   disposing a first electrical component including a first surface on the leadframe; and
   disposing a clip bond over a second surface of the first electrical component opposite the first surface of the first electrical component, wherein the clip bond extends vertically from a first surface of the semiconductor device to a second surface of the semiconductor device opposite the leadframe with a horizontal member disposed over the second surface of the first electrical component and a first vertical member extending from the horizontal member and exposed from the second surface of the semiconductor device.

13. The method of claim 12, wherein the clip bond further includes:
   providing a second vertical member extending from the horizontal member and exposed from the first surface of the semiconductor device; and
   providing a die contact integrated with the horizontal member over the first electrical component.

14. The method of claim 13, wherein the second vertical member further includes providing a clip foot exposed from the first surface of the semiconductor device.

15. The method of claim 12, further including depositing an encapsulant around the first electrical component and clip bond.

16. The method of claim 15, further including disposing a second electrical component over the encapsulant.

17. A semiconductor device, comprising:
   a leadframe, wherein a portion of the leadframe is exposed from a first surface of the semiconductor device;
   a first electrical component disposed on the leadframe;
   a first clip bond disposed over the first electrical component, wherein the first clip bond includes,
   (a) a horizontal member,
   (b) a vertical member extending from the horizontal member and exposed from the second surface of the semiconductor device, and
   (c) a die contact integrated with the horizontal member over the first electrical component;
   a second electrical component disposed over the first clip bond; and
   a second clip bond disposed over the second electrical component, wherein the second clip bond includes a horizontal member disposed over the second electrical component and a vertical member extending from the horizontal member and exposed from a second surface of the semiconductor device opposite the first surface of the semiconductor device.

18. The semiconductor device of claim 17, wherein the vertical member includes a clip foot exposed from the second surface of the semiconductor device.

19. The semiconductor device of claim 17, wherein the second clip bond includes a die contact integrated with the horizontal member over the second electrical component.

20. The semiconductor device of claim 17, further including an encapsulant deposited around the first electrical component, second electrical component, first clip bond, and second bond clip.

21. The semiconductor device of claim 20, further including a third electrical component disposed over the encapsulant.

22. The semiconductor device of claim 17, further including a bond wire coupled between the first electrical component and leadframe.

23. The semiconductor device of claim 17, further including a bond wire coupled between the first electrical component and second electrical component.

24. A semiconductor device, comprising:
   a leadframe exposed from a first surface of the semiconductor device;
   a plurality of first electrical components disposed over the leadframe;
   a first clip bond disposed over a first one of the first electrical components, wherein the first clip bond includes,
   (a) a horizontal member,
   (b) a vertical member extending from the horizontal member and exposed from the second surface of the semiconductor device, and
   (c) a die contact integrated with the horizontal member over the first one of the first electrical components; and
   a second clip bond disposed over a second one of the first electrical components, wherein the second clip bond includes a horizontal member disposed over the second one of the first electrical components and a vertical member extending from the horizontal member and exposed from a second surface of the semiconductor device opposite the first surface of the semiconductor device.

25. The semiconductor device of claim 24, wherein the vertical member includes a clip foot exposed from the second surface of the semiconductor device.

26. The semiconductor device of claim 24, wherein the second clip bond includes a die contact integrated with the horizontal member over the second one of the first electrical components.

27. The semiconductor device of claim 24, further including an encapsulant deposited around the first electrical components, first clip bond, and second clip bond.

28. The semiconductor device of claim 27, further including a second electrical component disposed over the encapsulant.

29. The semiconductor device of claim 24, further including a bond wire coupled between the first one of the first electrical components and the leadframe.

* * * * *